(12) United States Patent
Ooishi

(10) Patent No.: US 6,791,869 B2
(45) Date of Patent: Sep. 14, 2004

(54) NONVOLATILE MEMORY DEVICE WITH CONFIGURATION SWITCHING THE NUMBER OF MEMORY CELLS USED FOR ONE-BIT DATA STORAGE

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/410,134

(22) Filed: Apr. 10, 2003

(65) Prior Publication Data

US 2004/0062074 A1 Apr. 1, 2004

(30) Foreign Application Priority Data

Sep. 30, 2002 (JP) ........................................ 2002-286173

(51) Int. Cl.[7] .............................................. G11C 11/00
(52) U.S. Cl. ........................ 365/158; 365/171; 365/210
(58) Field of Search ................................. 365/158, 171, 365/210, 173, 189.01, 189.07

(56) References Cited

U.S. PATENT DOCUMENTS 6,331,943 B1 * 12/2001 Naji et al. .................. 365/158

FOREIGN PATENT DOCUMENTS

JP 2002-032983 A 1/2002

OTHER PUBLICATIONS

Scheuerlein et al., "A 10ns Read and Write Non–Volatile Memory Array Using a Magnetic Tunnel Junction and FET Switch in Each Cell", IEEE ISSCC Digest of Technical Papers, TA7.2, Feb. 2000, pp. 94–95, 129–129, 409–410.
"Forefront of Non–Volatile Memory/The Future in Intel's Mind: From Flash Memory to OUM", Nikkei Microdevices, Mar. 2002, pp. 65–78 (with Partial English Translation).

* cited by examiner

Primary Examiner—David Lam
(74) Attorney, Agent, or Firm—Burns, Doane, Swecker & Mathis, L.L.P.

(57) ABSTRACT

A memory cell array has a plurality of memory cells and dummy memory cells. A column select portion switches access control to a memory cell in accordance with a mode control signal. The column select portion selects one memory cell column to connect a first or second bit line connected with one selected memory cell and first and second reference data lines connected with the dummy memory cells to a data read circuit in a first mode. The column select portion connects the first and second bit lines respectively connected to paired two selected memory cells storing data complimentary to each other to the data read circuit in a second mode.

18 Claims, 24 Drawing Sheets

NONVOLATILE MEMORY DEVICE WITH CONFIGURATION SWITCHING THE NUMBER OF MEMORY CELLS USED FOR ONE-BIT DATA STORAGE

BACKGROUND OF THE INVENTION

1. Field of the Invention

The present invention relates to a nonvolatile memory device and more particularly to a nonvolatile memory device with memory cells characterized in that a passing current in reading data changes depending on a level of binary stored data.

2. Description of the Background Art

Recently, an MRAM (Magnetic Random Access Memory) device has attracted attention as a new-generation nonvolatile memory device. The MRAM device is a nonvolatile memory device using a plurality of magnetic thin films formed in a semiconductor integrated circuit to store data nonvolatally and allowing random access for each of magnetic thin films. In particular, in recent years, a magnetic thin film making use of a magnetic tunnel junction (MTJ) is used as a memory cell to dramatically improve the performance of the MRAM device, as reported for example in a reference such as "A 10 ns Read and Write Non-Volatile Memory Array Using a Magnetic Tunnel Junction and FET Switch in each Cell", Roy Scheuerlein et al., (2000 IEEE ISSCC Digest of Technical Papers, TA7.2).

A memory cell having a magnetic tunnel junction (referred to as a "MTJ memory cell" hereinafter) can be configured with an MTJ element and an access element (for example a transistor) and thus is advantageous in high integration. An MTJ element has a magnetic layer that can be magnetized in a direction corresponding to an applied magnetic field. An MTJ memory cell stores data by taking advantage of the characteristics of an electric resistance (junction resistance) in the MTJ element that changes according to a magnetization direction of the magnetic layer.

To read stored data in an MTJ memory cell, it is necessary to sense an electric resistance difference corresponding to a stored data level. Specifically, data is read based on a passing current in the MTJ memory cell that changes according to an electric resistance (that is stored data).

However, the electric resistance of the MTJ element is generally on the order of a few tens of kilohms (k$\Omega$: $10^3$ $\Omega$) and an electric resistance difference resulting from the difference of stored data levels is approximately 20–30% thereof Furthermore, the aforementioned passing current is on the order of microampere ($\mu$A: $10^{-6}$A) as the voltage applied at the time of a data read is suitably about 0.5V in consideration of the reliability of the MTJ element.

In an array configuration allowing one-bit data to be stored for each MTJ memory cell, it is necessary to compare a passing current of one MTJ memory cell selected for a data read with a prescribed reference current for reading. In such an array configuration, while a high integration can be attained by reducing the area per bit, it is necessary to sense a current with high accuracy as described above, resulting in a likelihood that a data read accuracy is decreased with a varied current level resulting from manufacturing variations.

Therefore, in an application that strongly requires the reliability of stored data, as introduced in the aforementioned reference, it is desirable to employ an array configuration that allows one-bit data to be stored with two MTJ memory cells in which complimentary data is written.

However, since such an array configuration prevents a high integration, sufficient performance cannot be obtained in an application having a priority in a stored data capacity.

While the important property is different depending on the application of the memory device in this way, different array configurations employed depending on the application incur a complicated design and manufacturing cost, which adversely affects the cost. This problem becomes conspicuous particularly in the case where the MRAM device is incorporated into a system LSI (Large Scale Integrated circuit) configured with a plurality of function blocks having different applications.

SUMMARY OF THE INVENTION

It is an object of the present invention to provide a configuration of a nonvolatile memory device having a configuration capable of switching the number of memory cells required for storing one bit including the same.

A nonvolatile memory device in accordance with the present invention includes: a memory cell array having a plurality of memory cells arranged in a matrix, the memory cell having a passing current in reading data changed in first and second states respectively in accordance with levels of binary stored data; an access control circuit for switching access to the plurality of memory cells based on an input address between a first mode in which each of the plurality of memory cells stores one-bit data and a second mode in which each pair of two of the plurality of memory cells stores one-bit data; a data read circuit reading data from a memory cell of the plurality of memory cells that is selected to be accessed by the access control circuit; and a data write circuit writing data into the memory cell of the plurality of memory cells that is selected to be accessed.

Therefore the main advantage of the present invention is in that the number of memory cells required for one-bit storage can be switched in a common array configuration in the nonvolatile memory device. Therefore it is possible to flexibly handle both of an application having a priority in a data capacity and an application having a priority in data reliability without changing an array configuration.

A nonvolatile memory device in accordance with another configuration of the present invention includes: a plurality of memory cells having a passing current in reading data changed in first and second states respectively in accordance with levels of binary stored data; and a plurality of dummy cells provided to be compared with the plurality of memory cells in reading data and having same characteristic as the plurality of memory cells, wherein at least ones of the plurality of dummy cells are respectively set to the first and second states. The nonvolatile memory device further includes a data read circuit, based on access to a selected memory cell selected to be accessed of the plurality of memory cells and to the plurality of dummy cells, reading the stored data from the selected memory.

In such a nonvolatile memory device, in a memory cell array configuration having a dummy memory cell having characteristics similar to those of a normal cell, data can be read with reference to dummy memory cells having characteristics similar to those of memory cells respectively storing binary levels. As a result, a simplified manufacturing process and stabilized memory cell characteristics result because of the continuity in cell structures and in addition a data read accuracy can be improved.

A nonvolatile memory device in accordance with yet another configuration of the present invention includes: a plurality of memory cell blocks; and a data read circuit provided to be shared by the plurality of memory cell blocks. Each of the plurality of memory cell blocks includes a plurality of memory cells having a passing current in reading data changed in first and second states respectively in accordance with levels of binary stored data, and a plurality of dummy cells provided to be compared with the plurality of memory cells in reading data and having same characteristics as the plurality of memory cells, wherein one of the plurality of memory cells is selected as a memory cell from which data is to be read in one of the plurality of memory cell blocks. The data read circuit reads the stored data from the memory cell from which data is to be read based on respective access to the memory cell from which data is to be read and to one of the plurality of dummy memory cells included in another one of the plurality of memory cell blocks.

In such a nonvolatile memory device, a selected memory cell from which data is to be read and a dummy memory cell to be compared with the selected memory cell respectively belong to different memory cell blocks. Therefore the integration in each memory cell block can be improved without incurring complicated control of the connection between signal lines in accordance with an input address.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
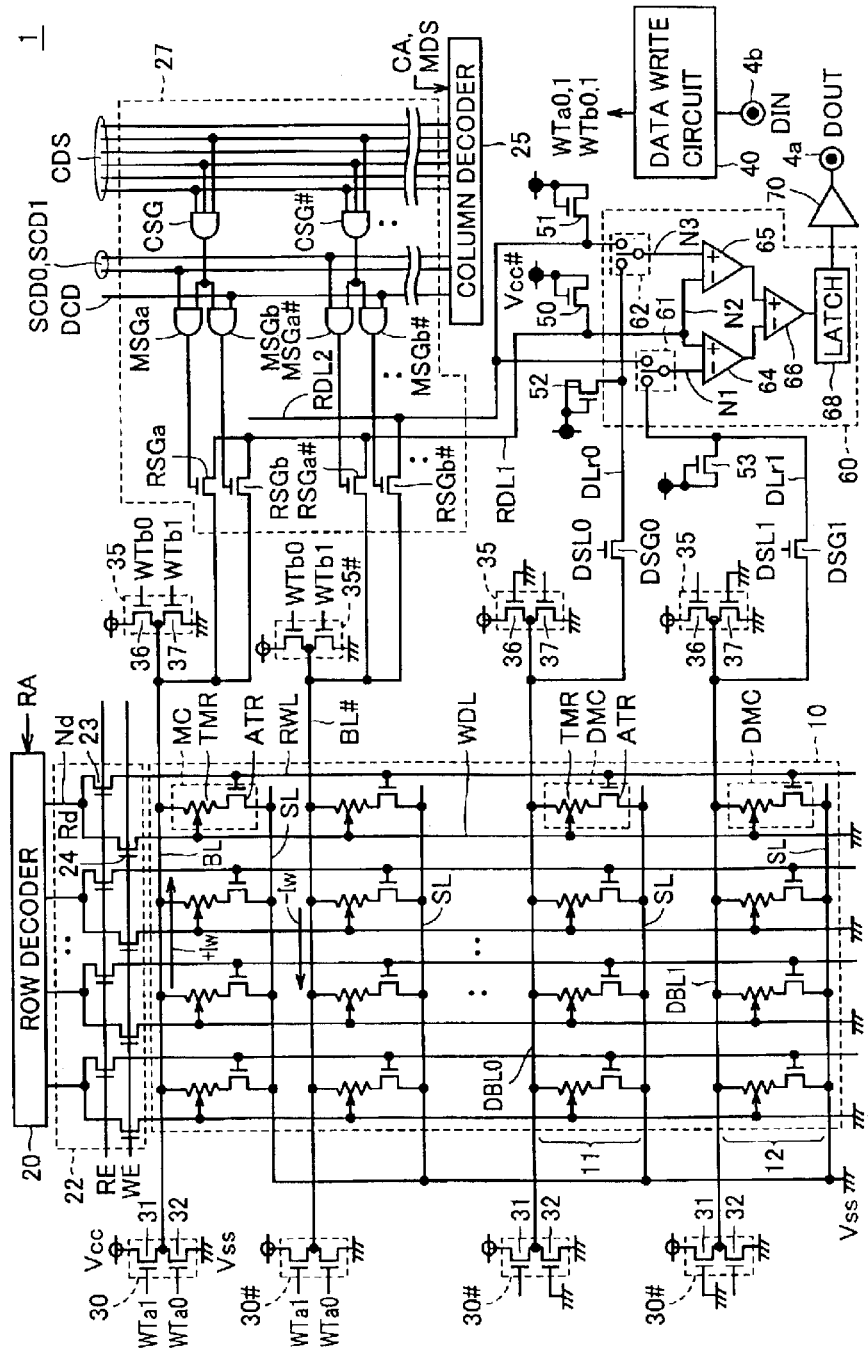
FIG. 1 is a circuit diagram illustrating a configuration of an MRAM device shown as a representative example of a nonvolatile memory device in accordance with a first embodiment of the present invention.

In the following, the embodiments of the present invention will be described in detail with reference to the figures. It is noted that in the figures, the same or corresponding parts will be denoted with the same reference characters.

First Embodiment

FIG. 1 is a circuit diagram illustrating a configuration of an MRAM device 1 shown as a representative example of a nonvolatile memory device in accordance with a first embodiment of the present invention.

It is noted that, as will be apparent in the following description, the application of the present invention is not limited to an MRAM device with MTJ memory cells. In other words, the present invention can be applied in common to a nonvolatile memory device with memory cells characterized in that the passing current in reading data changes depending on binary stored data.

Referring to FIG. 1, MRAM device 1 in accordance with the first embodiment includes data terminals 4a and 4b, a memory cell array 10, a row decoder 20, a row select portion 22, a column decoder 25, and a column select portion 27.

Memory cell array 10 has a plurality of MTJ memory cells. These MTJ memory cells are classified into normal memory cells MC (simply referred to as "memory cells MC" hereinafter) and dummy memory cells DMC forming dummy cell columns 11 and 12. Dummy memory cells DMC arranged in dummy cell columns 11 and 12 have the same characteristics (shape and structure) as memory cells MC, and are arranged to share memory cell rows with memory cells MC. Each MTJ memory cell includes a tunneling magneto-resistance element TMR and an access transistor ATR.

The configuration and data storing principle of the MTJ memory cell will now be described.

Figure 2:
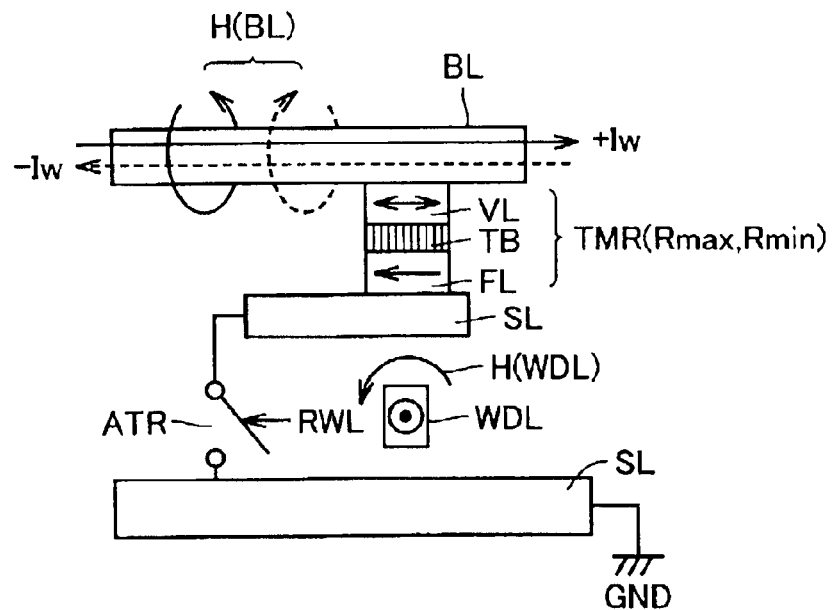
FIG. 2 is a conceptual diagram illustrating an MTJ memory cell configuration and a data store principle.

Referring to FIG. 2, a tunneling magneto-resistance element TMR has a ferromagnetic layer (simply referred to as a "fixed magnetic layer" hereinafter) FL having a certain fixed magnetization direction, and a ferromagnetic layer (simply referred to as a "free magnetic layer" hereinafter) VL that can be magnetized in a direction corresponding to an externally applied magnetic field. A tunneling barrier (tunneling film) TB formed of an insulator film is provided between fixed magnetic layer FL and free magnetic layer VL. The free magnetic layer VL is magnetized in the same direction as fixed magnetic layer FL or in the opposite direction to fixed magnetic layer FL depending on the level of stored data to be written. A magnetic tunnel junction is formed by these fixed magnetic layer FL, tunneling barrier TB and free magnetic layer VL.

The electric resistance of tunneling magneto-resistance element TMR varies depending on the correlation between the respective magnetization directions of fixed magnetic layer FL and free magnetic layer VL. Specifically, the electric resistance of tunneling magneto-resistance element TMR attains a minimum value Rmin when the magnetization direction of fixed magnetic layer FL and the magnetization direction of free magnetic layer VL are same (parallel), and attains a maximum value Rmax when both of the magnetization directions are opposite (antiparallel).

In writing data, a read word line RWL is inactivated and access transistor ATR is turned off. In this state, data write currents for magnetizing free magnetization layer VL flow in a direction corresponding to a level of written data respectively in a bit line BL and a write digit line WDL.

Figure 3:
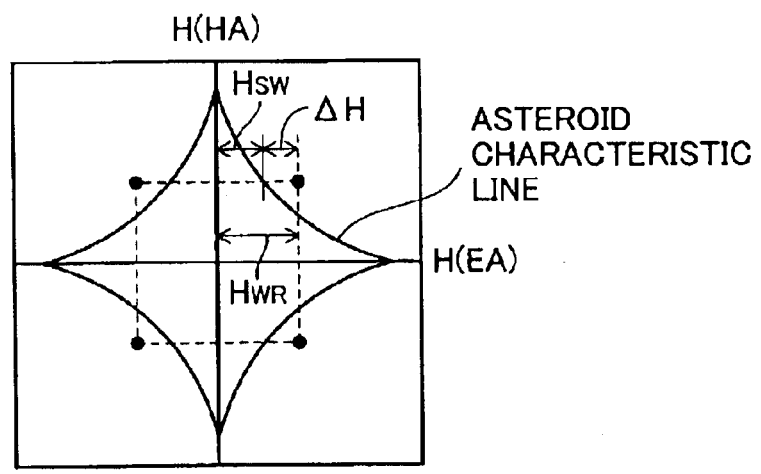
FIG. 3 is a conceptual diagram showing the relation between a supply of a data write current into an MTJ memory cell and a magnetization direction of a tunneling magneto-resistance element.

FIG. 3 is a conceptual diagram showing the relation between a supply of a data write current to MTJ memory cell and a magnetization direction of a tunneling magneto-resistance element.

Referring to FIG. 3, the lateral axis H (EA) shows a magnetic field applied in an easy axis (EA) direction in free magnetic layer VL in tunneling magneto-resistance element TMR. On the other hand, the vertical axis H (HA) shows a magnetic field acting in a hard axis (HA) direction in free magnetic layer VL. Magnetic fields H (EA) and H (HA) respectively correspond to one of two magnetic fields created by currents respectively flowing in bit line BL and write digit line WDL.

In the MTJ memory cell, the fixed magnetization direction of fixed magnetic layer FL is along the easy axis of free magnetic layer VL, and free magnetic layer VL is magnetized in the direction parallel or antiparallel (opposite) to fixed magnetic layer FL along the easy axis direction depending on the level of stored data. The MTJ memory cell can store one-bit data corresponding to two magnetization directions of free magnetic layer VL.

The magnetization direction of free magnetic layer VL can be rewritten only when the sum of applied magnetic fields H (EA) and H (HA) reaches a region outside an asteroid characteristic line shown in FIG. 3. In other words, when the applied data write magnetic field has a strength corresponding to a region inside the asteroid characteristic line, the magnetization direction of free magnetic layer VL does not change.

As indicated by the asteroid characteristic line, a magnetization threshold necessary for changing a magnetization direction along the easy axis can be reduced by applying a magnetic field in the hard axis direction on free magnetic layer VL. As shown in FIG. 3, an operational point in writing data is designed such that the stored data of the MTJ memory cell that is the magnetization direction of tunneling magneto-resistance element TMR is rewritten when a prescribed data write current flows in both write digit line WDL and bit line BL.

In the operational point illustrated in FIG. 3, a data write magnetic field in the easy axis direction is designed to have its intensity of $H_{WR}$ in MTJ memory cell in to which data is written. Specifically, a value of the data write current flowing in bit line BL or write digit line WDL is designed to obtain this data write magnetic field $H_{WR}$. Generally, data write magnetic field $H_{WR}$ is represented by the sum of a switching magnetic field Hsw necessary for switching a magnetization direction and a margin $\Delta H$. Namely, $H_{WR}$= Hsw+$\Delta H$.

The magnetization direction once written in tunneling magneto-resistance element TMR, that is, the stored data in the MTJ memory cell is nonvolatally retained until new data is written. The electric resistance of each memory cell is, strictly speaking, the sum of tunneling magneto-resistance element TMR the on-resistance of, access transistor ATR and the other parasitic resistance, and the resistances excluding that of tunneling magneto-resistance element TMR are constant irrespective of stored data. Therefore, in the following, two kinds of electric resistances of normal memory cells depending on the stored data are also represented by Rmax and Rmin, and the difference between them is represented by $\Delta R$ (namely, $\Delta R$=Rmax−Rmin).

It is noted that each of dummy memory cells DMC belonging to dummy cell column 11 in FIG. 1 fixedly stores data corresponding to electric resistance Rmax that is written beforehand. On the other hand, dummy memory cell DMC belonging to dummy cell column 12 fixedly stores data corresponding to electric resistance Rmin that is written beforehand.

Returning to FIG. 1, in memory cell array 10, read word lines RWL and write digit lines WDL are arranged corresponding to respective memory cell rows shared by memory cells MC and dummy memory cells DMC. Bit lines BL and source voltage lines SL are arranged corresponding to respective memory cell columns configured with memory cells MC. Dummy bit line DBL0 and source voltage line SL are arranged for dummy cell column 11, and dummy bit line DBL1 and source voltage line SL are arranged for dummy cell column 12.

Memory cell MC has tunneling magneto-resistance element TMR and access transistor ATR connected in series between a corresponding bit line BL and source voltage line SL. Dummy memory cell DMC has tunneling magneto-resistance element TMR and ATR connected in series between dummy bit line DBL0 or DBL1 and the corresponding source voltage line SL. The gate of access transistor ATR is connected to the corresponding read word line RWL.

Row decoder 20 outputs a row decode signal Rd for each memory cell row based on a row address RA indicated by an input address. Row decoder 20 activates row decode signal Rd to a high level in a selected memory cell row (referred to as a "selected row" hereinafter), and inactivates row decode signal Rd to a low level in the remaining memory cell rows (referred to as a "non-selected row" hereinafter).

It is noted that in the following a binary high voltage state (for example a power supply voltage Vcc, Vcc#) and a low voltage state (for example a ground voltage Vss) of data, a data line, a signal, a signal line, and the like will be referred to a "H level" and a "L level", respectively.

Row select portion 22 has driver transistors 23 and 24 provided for each memory cell row. Driver transistor 23 is connected between a node Nd receiving a corresponding row decode signal Rd from row decoder 20 and a corresponding read word line RWL. Driver transistor 24 is connected between corresponding node Nd and write digit line WDL.

Driver transistors 23 and 24 have their respective gates receiving control signals RE and WE, respectively. Control signal RE is activated to H level in reading data and is inactivated in other cases. Similarly, control signal WE is activated to H level in writing data and is inactivated in other cases. Of opposite ends of each write digit line WDL, the one end opposite to row decoder 20 is connected to ground voltage Vss irrespective of an address select result.

Therefore, in reading data, in response to each driver transistor 23 turning on, in accordance with a level of a corresponding row decode signal Rd, read word line RWL in a selected row is activated to H level and read word line RWL in a non-selected row is inactivated to L level. On the other hand, since each driver transistor 24 is turned off, each write digit line WDL is inactivated to L level.

In writing data, in response to each driver transistor 24 turning on, a data write current in a direction from row decoder 20 to ground voltage Vss flows in write digit line WDL in a selected row having the corresponding row decode signal Rd activated. On the other hand, the data write current does not flow in write digit line WDL in a non-selected row since the both ends thereof are connected to ground voltage Vss. Each driver transistor 23 is turned off and each read word line RWL is inactivated to L level.

Column decoder 25 receives a column address CA indicated by an input address and a mode control signal MDS indicative of a decode mode in MRAM device 1. As will be clear in the following description, MRAM device 1 has a first mode in which each of memory cells MC stores one-bit data and second mode in which each pair of two memory cells MC stores one-bit data. Since in the first and second modes, one memory cell and a pair of two memory cells are selected to be accessed, respectively, based on the decode result of the input address, the respective modes will be referred to as a "one-cell decode mode" and a "two-cell decode mode" in the following, respectively. Mode control signal MDS is an electrical signal for indicating whether MRAM device 1 is operated in one-cell decode mode or in two-cell decode mode.

It is noted that in memory cell array 10, the columns of memory cells MC are divided sequentially two by two to form pairs, and at the time of the two-cell decode, in each of the pairs, the adjacent memory cells, i.e. two memory cells belonging to the same memory cell row form a pair to store one-bit data.

FIG. 1 representatively shows one of odd-numbered memory cell columns (referred to as an "odd column" hereinafter) and one of even-numbered memory cell columns (referred to as an "even column" hereinafter). In the following, a bit line in an odd column will be denoted with a bit line BL and a bit line in an even column will be denoted with a bit line BL#.

Column decoder 25 generates a column decode signal CDS, decode control signals SCD0, SCD1, DCD in response to mode control signal MDS and column address CA.

Column selection portion 27 includes a column select portion CSG, decode select portions MSGa and MSGb, and read select gates RSGa and RSGb that are provided corresponding to an odd column, as well as a column select portion CSG#, decode select portions MSGa# and MSGb#, and read select gates RSGa# and RSGb# that are provided corresponding to an even column.

The outputs of column select portions CSG and CSG# corresponding to the respective memory cell columns forming the same pair are controlled by the common column decode signal CDS. Therefore, in each of one-cell decode mode and two-cell decode mode, the outputs of column select portions CSG and CSG# belonging to the pair corresponding to the selected memory cells are activated to H level, and the outputs of the remaining column select portions CSG and CSG# are inactivated to L level.

In one-cell decode mode, one of decode control signals SCD0 and SCD1 is set to H level and the other is set to L level in accordance with column address CA. Decode control signal DCD is set to L level.

On the other hand, at the time of two-cell decode mode, each of decode control signals SCD0 and SCD1 is fixed at L level, and decode control signal DCD is set to H level.

In an odd column, decode select portion MSGa outputs an AND logical operation result of the output of the corresponding column select portion CSG and decode control signal SCD0. Decode select portion MSGb outputs an AND logical operation result of the output of the corresponding column select portion CSG and decode control signal DCD. In an even column, decode select portion MSGa# outputs an AND logical operation result of the output of the corresponding column select portion CSG# and decode control signal SCD1. Decode select portion MSGb# outputs an AND logical operation result of the output of the corresponding column select portion CSG# and decode control signal DCD.

In an odd column, read select gates RSGa and RSGb are connected in parallel between the corresponding bit line BL and read data line RDL1. The gates of read select gates RSGa and RSGb receive the outputs of decode select portions MSGa and MSGb, respectively.

On the other hand, in an even column, read select gates RSGa# and RSGb# are connected between the corresponding bit line BL# and read data lines RDL1 and RDL2, respectively. The gates of read select gates RSGa# and RSGb# receive the outputs of decode select portions MSGa# and MSGb#, respectively. Read select gates RSGa, RSGb and RSGa#, RSGb# are formed of N-channel MOS transistors.

Therefore, in reading data in one-cell decode mode, one memory cell column is selected, read select gate RSGa (or RSGa#) in the one selected column is turned on, and bit line BL or BL# in the selected column is connected to read data line RDL1. On the other hand, read data line RDL2 is not connected to any bit line.

On the other hand, in reading data in two-cell decode mode, two memory cell columns (an odd column and an even column) forming a pair are selected, and read select gates RSGb and RSGb# turn on in the respective two selected columns. As a result, bit lines BL and BL# in the selected columns are connected to read data lines RDL1 and RDL2.

In column select portion 27, the same configuration is provided corresponding to each memory cell column, though not shown.

In this way, row decoder 20, column decoder 25 and column select portion 27 switch the access to memory cell MC based on the input address. Specifically, in one-cell decode mode, one memory cell in accordance with an input address of memory cells MC is selected to be accessed while in two-cell decode mode, one of pairs of two memory cells MC is selected in accordance with an input address and two memory cells forming that pair are selected to be accessed.

The configuration of data write will now be described.

MRAM device 1 includes bit line drivers 30 and 35 provided corresponding to each memory cell column and a data write circuit 40.

Bit line driver 30 has driver transistors 31 and 32 connected between the one end side of the corresponding bit line BL (or BL#) and the power supply voltage Vcc and the ground voltage Vss, respectively. Similarly, a bit line driver 35 has driver transistors 36 and 37 connected between the other end side of the corresponding bit line BL (or BL#) and the power supply voltage Vcc and ground voltage Vss, respectively.

The gates of driver transistors 31 and 32 receive write control signals WTa1 and WTa0, respectively. The gates of driver transistors 36 and 37 receive write control signals WTb0 and WTb1, respectively. Each of driver transistors 31, 32, 36 and 37 is formed of an N-channel MOS transistor having a relatively large current driving ability in order to supply a sufficient data write current with a small number of transistors.

In each memory cell column, bit line driver 30 drives the one end of the corresponding bit line BL, BL# to one of power supply voltage Vcc and ground voltage Vss or brings it into a floating state without connecting to either voltages, in accordance with write control signals WTa0 and WTa1. Similarly, bit line driver 35 drives the other end of the corresponding bit line BL, BL# to one of power supply voltage Vcc and ground voltage Vss or brings it into a floating state in accordance with write control signals WTb0 and WTb1. Each of bit lines BL and BL# in the floating state is precharged to a fixed voltage by a precharge circuit (not shown) as necessary.

Data write circuit 40 controls write control signal WTa0, WTa1, WTb0, WTb1 in each memory cell column in accordance with input data DIN to data terminal 4b, a setting of the decode mode, and a column select result. Write control signal WTa0, WTa1, WTb0, WTb1 is set such that data write current +Iw or −Iw in a direction corresponding to write data flows through bit line BL (or BL#) in a selected column.

In writing data in one-cell decode mode, a data write current in a direction corresponding to input data DIN flows in bit line BL (or BL#) in a selected column in order to write input data DIN into one selected memory cell. In writing data in two-cell decode mode, data write currents in directions opposite to each other flow in bit lines BL and BL# respectively corresponding to two selected columns in order to write complimentary data reflecting input data DIN into a pair of two selected memory cells.

In writing data, bit line BL (or BL#) in a non-selected column has its opposite ends connected to the same voltage (for example ground voltage Vss) so that an intentional current does not flow. On the other hand, except at the time of the data write, each bit line driver 30, 35 brings the corresponding bit line BL, BL# into a floating state.

The detail of the data write operation including the configuration of data write circuit 40, the setting of write control signal WTa0, WTa1, WTb0, WTb1, and the like will be described later.

At the opposite ends of dummy bit lines DBL0 and DBL1, bit line drivers 30 and 35 are also arranged in a similar manner. Strictly speaking, at the time of the normal operation, data does not have to be written in dummy memory cell DMC in which prescribed data is once written. Therefore, it is essentially unnecessary to arrange bit line driver 30, 35 and write digit line WDL in a region corresponding to dummy memory cells DMC. However, in order to ensure the continuity in shape in memory cell array 10 and the peripheral region thereof to facilitate the manufacturing process, bit line drivers 30 and 35 are also arranged for dummy bit lines DBL0 and DBL1, and write digit lines WDL are also arranged to pass through the region corresponding to dummy memory cells DMC.

In order to prevent an erroneous write into dummy memory cell DMC, however, the gates of driver transistors 32 and 36 corresponding to dummy bit line DBL0 are fixed to ground voltage Vss so that a data write current for writing electric resistance Rmin (for example −Iw) does not flow into dummy bit line DBL0. Similarly, the gates of driver transistors 31 and 37 corresponding to dummy bit line DBL1 are fixed to ground voltage Vss so that a data write current for writing electric resistance Rmax (for example +Iw) does not flow into dummy bit line DBL1.

The configuration regarding a data read will now be described.

MRAM device 1 further includes read data lines RDL1 and RDL2, reference data lines DLr0 and DLr1, dummy select gates DSG0 and DSG1, current supply transistors 50–53, a data read circuit 60, and an output buffer 70.

Current supply transistor 50 and 51 are formed of for example N-channel MOS transistors and are connected between read data lines RDL1 and RDL2 and power supply voltage Vcc#, respectively. Current supply transistors 52 and 53 are formed of for example N-channel MOS transistors, and are connected between reference data lines DLr0 and DLr1 and power supply voltage Vcc#, respectively. Each of current supply transistors 50–53 has an equal current driving ability and has its gate connected for example to power supply voltage Vcc#. Accordingly, each of read data line RDL1, RDL2 and reference data line DLr0, DLr1 is pulled up by power supply voltage Vcc#. It is noted that the gates of current supply transistors 50–53 may receive signals activated at the time of a data read operation so that the read data line and reference data line are pulled up by power supply voltage Vcc# only at the time of the data read operation.

A dummy select gate DSG0 is connected between dummy bit line DBL0 and reference data line DLr0 and turns on in response to activation (H level) of dummy control signal DSL0. A dummy select gate DSG1 is connected between dummy bit line DBL1 and reference data line DLr1 and turns on/off in response to dummy control signal DSL1. Dummy select gate DSG0, DSG1 is formed of for example an N-channel MOS transistor. Each of dummy control signals DSL0 and DSL1 is set to H level in one-cell decode mode and is set to L level in two-cell decode mode.

It is noted that each of read select gate RSGa, RSGb, RSGa#, RSGb# and dummy select gate DSG0, DSG1 are forcedly turned off irrespective of the decode mode and the column select result except at the time of the data read.

Data read circuit 60 has switches 61 and 62, sense amplifiers 64–66, and a latch circuit 68. Switch 61 selectively connects one of read data line RDL2 and reference data line DLr1 to a node N1. Switch 62 selectively connects one of read data line RDL2 and reference data line DLr0 to a node N3. A node N2 is connected with read data line RDL1.

Sense amplifier 64 amplifies a voltage difference (or a current difference) of node N1 relative to node N2, and sense amplifier 65 amplifies a voltage difference (or a current difference) of node N3 relative to node N2 in a polarity opposite to that of sense amplifier 64. Sense amplifier 66 further amplifies an output difference between sense amplifiers 64 and 65. Latch circuit 68 latches an output of sense amplifier 66 at the timing when the output from sense amplifier 66 reaches an amplitude equal to or more than a prescribed level, in consideration of a time required for the amplifying operations of sense amplifiers 64–66. Output buffer 70 outputs latch data of latch circuit 68 as output data DOUT to data terminal 4a.

The data reads in the respective decode modes will now be described in detail.

Figure 4:
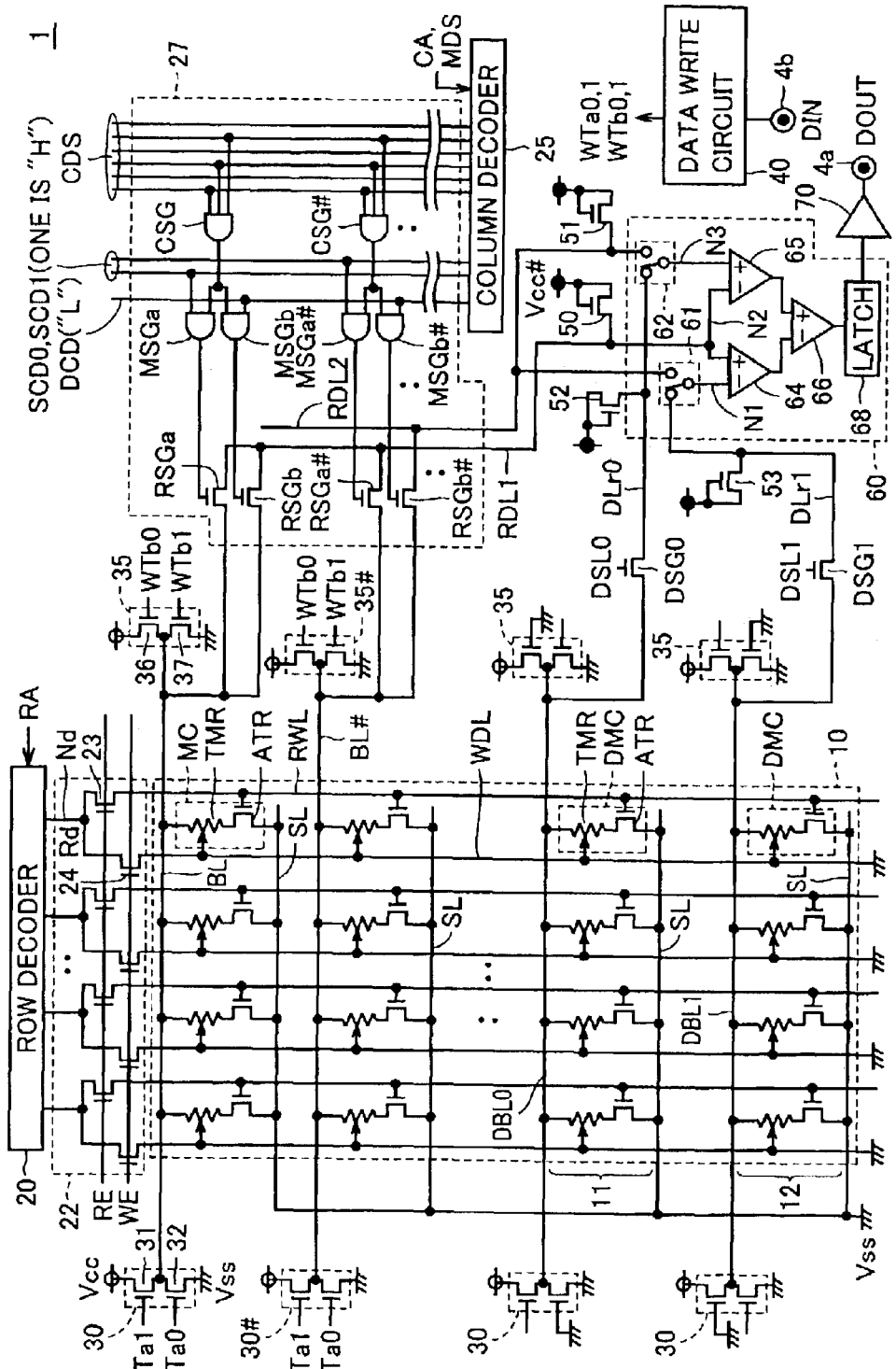
FIG. 4 is a circuit diagram illustrating a data read in a one-cell decode mode in the MRAM device shown in FIG. 1.

FIG. 4 is a circuit diagram illustrating the data read in one-cell decode mode in MRAM device 1.

Referring to FIG. 4, in reading data, in response to row address RA, read word line RWL in a selected row is activated to H level and access transistor ATR turns on in the corresponding memory cell MC and dummy memory cell DMC. Accordingly, each of bit line BL, BL# and dummy bit line DBL0, DBL1 is pulled down to ground voltage Vss through the corresponding tunneling magneto-resistance element TMR.

As described before, in one-cell decode mode, column select portion 27 connects bit line BL (or BL#) in a selected column to read data line RDL1, and does not connect read data line RDL2 to any bit line. Therefore, a current and voltage in accordance with electric resistance Rmax or Rmin (that is stored data) in the selected memory cell is generated in read data line RDL1.

On the other hand, since each of dummy select gates DSG0 and DSG1 is turned on, a current and voltage corresponding to electric resistance Rmax is generated in reference data line DLr0, and a current and voltage in accordance with electric resistance Rmin is generated in reference data line DLr1.

Switches 61 and 62 connect reference data lines DLr1 and DLr0 to nodes N1 and N3, respectively, in one-cell decode mode. As a result, sense amplifier 64 compares the results of respective access to the selected memory cell and dummy memory cell DMC (electric resistance Rmin). Sense amplifier 65 compares the results of respective access to the selected memory cell and dummy memory cell DMC (electric resistance Rmax). As a result, the output of one of sense amplifiers 64 and 65 hardly swings whereas the other output swings in a different polarity in accordance with the stored data in the selected memory cell. Therefore, the stored data can be read from the selected memory cell by further amplifying the outputs of sense amplifiers 64 and 65 using sense amplifier 66.

Figure 5:
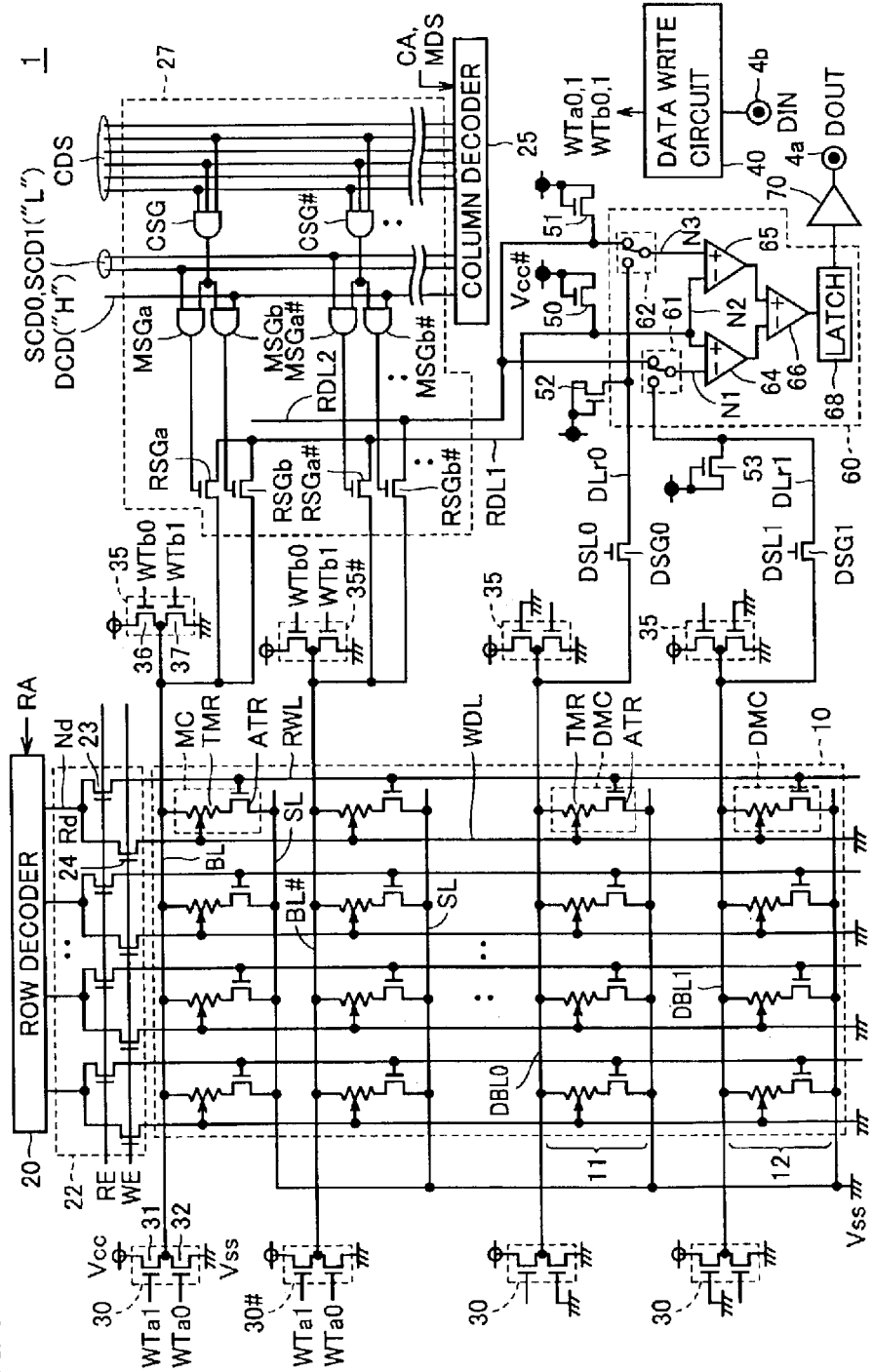
FIG. 5 is a circuit diagram illustrating a data read in a two-cell decode mode in the MRAM device shown in FIG. 1.

FIG. 5 is a circuit diagram illustrating the data read in two-cell decode mode in MRAM device 1.

Referring to FIG. 5, the row select in two-cell decode mode is performed in a similar manner to one-cell decode mode. Specifically, each of bit line BL, BL# and dummy bit line DBL0, DBL1 is pulled down to ground voltage Vss through the corresponding tunneling magneto-resistance element TMR.

As described before, in two-cell decode mode, column select portion 27 connects bit lines BL and BL# in the selected columns to read data lines RDL1 and RDL2, respectively. Therefore, in read data lines RDL1 and RDL2, a current and voltage corresponding to an electric resistance (that is stored data) in one of two selected memory cells is generated. On the other hand, each of dummy select gates DSG0 and DSG1 turns off.

Switches 61 and 62 connect read data line RDL2 to nodes N1 and N3, respectively, in two-cell decode mode. As a result, sense amplifiers 64 and 65 compare the results of the respective access to the two selected memory cells into which complimentary data is written, in polarities opposite to each other. As a result, the outputs of sense amplifiers 64 and 65 swing in the respective different polarities in accordance with the stored data in the selected memory cell. Therefore, the outputs of sense amplifiers 64 and 65 are further amplified by sense amplifier 66 so that it can be sensed whether the electric resistance of the selected memory cell is closer to Rmax or Rmin. As a result, the stored data in the selected memory cell can be read.

The data writes in the respective decode modes will now be described in detail.

Figure 6:
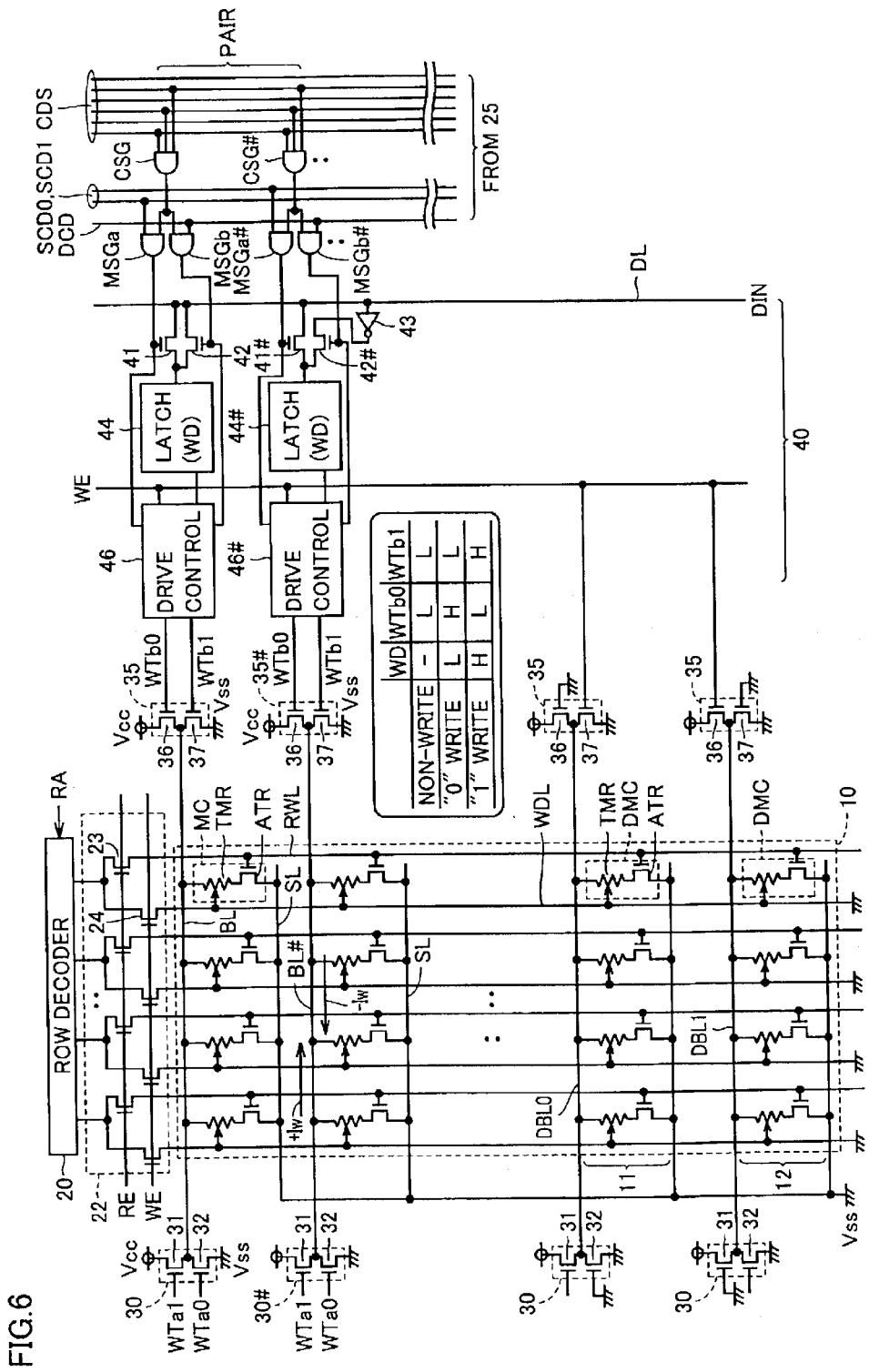
FIG. 6 is a circuit diagram showing a configuration of a data write circuit shown in FIG. 1.

FIG. 6 is a circuit diagram showing the configuration of data write circuit 40 shown in FIG. 1.

Referring to FIG. 6, data write circuit 40 has transmission gates 41 and 42, a latch circuit 44, and a drive control circuit 46 that are provided corresponding to each of odd columns, as well as transmission gates 41# and 42#, an inverter 43, a latch circuit 44#, and a drive control circuit 46# that are provided corresponding to each of even columns.

Transmission gates 41 and 42 are connected in parallel between latch circuit 44 and write data line DL transmitting input data DIN input to data terminal 4b. Transmission gates 41 and 42 are formed of N-channel MOS transistors and receive the outputs of decode select portions MSGa and MSGb as illustrated in FIG. 1, respectively, as their respective gates.

Inverter 43 inverts and outputs input data DIN on write data line DL. Transmission gate 41# is connected between write data line DL and latch circuit 44#, and transmission gate 42# is connected between the output node of inverter 43 and latch circuit 44#. Transmission gates 41# and 42# are formed of N-channel MOS transistors and receive the outputs of decode select portions MSGa# and MSGb# as illustrated in FIG. 1, respectively, at their respective gates.

Therefore, in one-cell decode mode, in one selected column corresponding to the selected memory cell, transmission gate 41 or 41# turns on and input data DIN is transmitted to the corresponding latch circuit 44 or 44# and retained as write data WD.

On the other hand, in two-cell decode mode, in the respective two selected columns forming a pair corresponding to the selected memory cells, transmission gates 42 and 42# turn on. As a result, input data DIN and the inverted data thereof are transmitted respectively to latch circuits 44 and 44# respectively corresponding to the two selected columns and retained as write data WD.

Each of drive control circuits 46 and 46# generates write control signals WTa0, WTa1, WTb0 and WTb1 controlling the operation of the corresponding bit line drivers 30 and 35, in accordance with the select result of the corresponding memory cell columns and write data WD latched by the corresponding latch circuits 44, 44#.

The operations of drive control circuits 46 and 46# corresponding to the odd column and the even column, respectively, are common. The operation of each drive control circuit is common to one-cell decode mode and two-cell decode mode.

Each drive control circuit 46,46# sets each of write control signals WTa0, WTa1, WTb0, WTb1 to L level in order to perform a non-write operation except at the time of a data write (control signal WE=L level) or when the corresponding memory cell column is non-selected even at the time of a data write, that is, when both the outputs of the corresponding decode select portions MSGa and MSGb (or MSGa# and MSGb#) are at L level. Therefore, at the time of the non-write operation, the corresponding bit line BL (BL#) is set to the floating state.

On the other hand, at the time of a data write (WE=H level) and when the corresponding memory cell column is selected, that is, when at least one of the output signals of decode select portions MSGa and MSGb (or MSGa# and MSGb#) is at H level, each drive control circuit 46, 46# sets write control signals WTa0, WTa1, WTb0, WTb1 in accordance with write data WD latched by the corresponding latch circuits 44, 44#.

Specifically, one of write control signals WTa0 and WTa1 that corresponds to write data WD is set to H level and the other is set to L level. Furthermore, write control signals WTb0 and WTb1 are set complimentary to write control signals WTa0 and WTa1, respectively. For example when write data WD is at "H", write control signals WTa1 and WTb0 are set to H level and write control signals WTa0 and WTb1 are set to L level. As a result, data write current +Iw flows in a direction from bit line driver 30 toward 35 through the bit line in the selected column. On the contrary, when the write data WD is at "L", write control signals WTa0 and WTb1 are set to H level and write control signals WTa1 and WTb0 are set to L level. As a result, data write current –Iw flows in a direction from bit line driver 35 toward 30 through the bit line in the selected column.

In data write circuit 40, the similar configuration is provided corresponding to each odd column and each even column. It is noted that the drive voltage of bit line driver 30, 35 may be an independent voltage other than ground voltage Vss and power supply voltage Vcc.

Furthermore, as described above, the data write current in a prescribed direction flows in write digit line WDL in the selected row. The data write current flowing in write digit line WDL produces a magnetic field along the hard axis direction in memory cell MC. On the other hand, a data write current flowing in bit line BL, BL# produces a magnetic field along the easy axis direction in memory cell MC. Write data in accordance with the direction of the data write current on bit line BL, BL# is magnetically written in memory cell MC where the data write current flows both in the corresponding write digit line WDL and bit line BL, BL#.

As a result, in writing data in one-cell decode mode, input data DIN is written in one selected memory cell. In writing data in two-cell decode mode, input data DIN is written into one (the odd column) of the paired two selected memory cells and inverted data (complimentary data) of input data DIN is written into the other memory cell (the even column).

In this way, in response to mode control signal MDS that is an electrical signal, the data read and data write operations can be switched corresponding to one-cell decode mode and two-cell decode mode.

Figure 7:
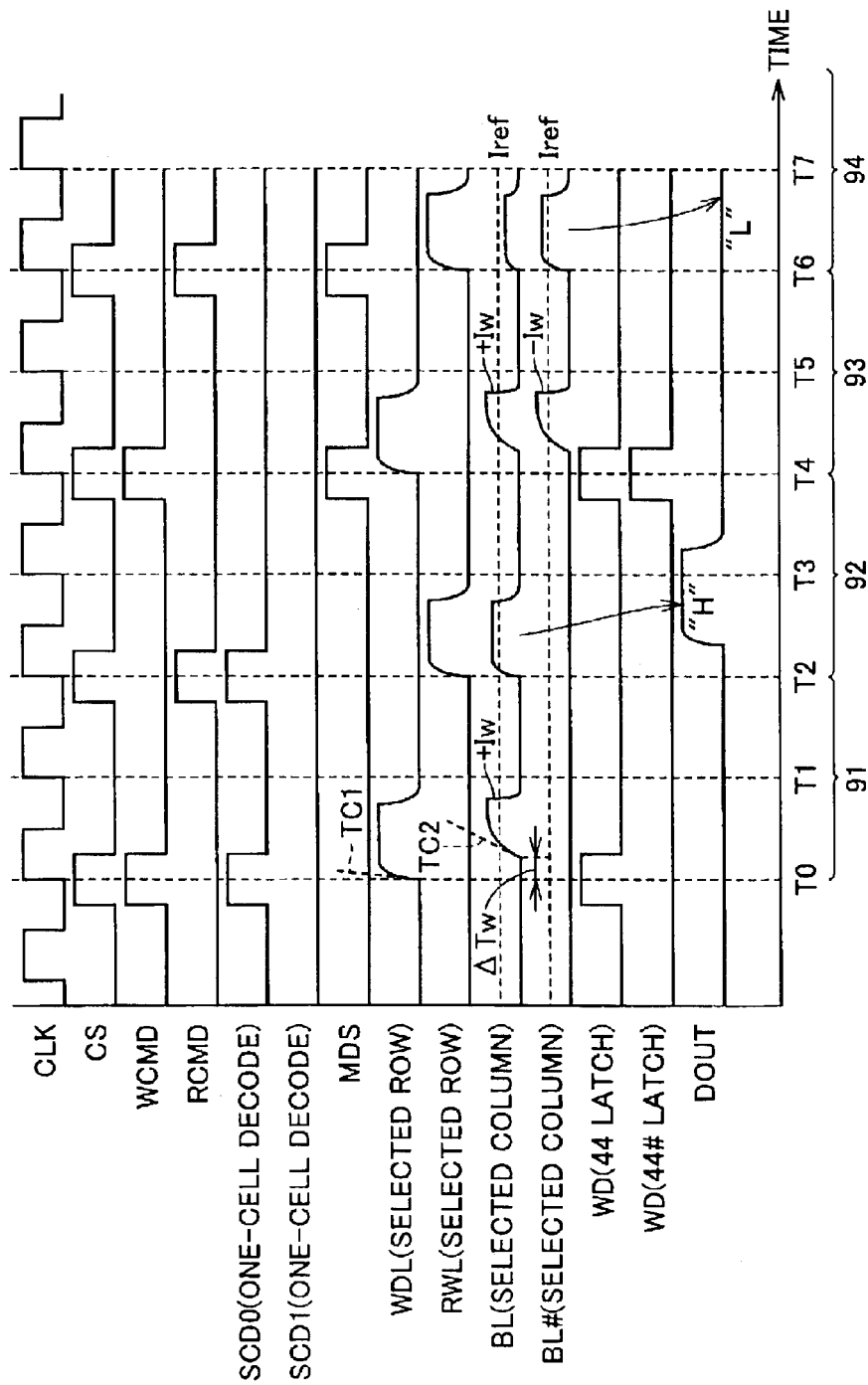
FIG. 7 is an operation waveform diagram illustrating data read and data write operations in the MRAM device shown in FIG. 1.

FIG. 7 is an operation waveform diagram illustrating the data read and data write operations in the MRAM device shown in FIG. 1.

Referring to FIG. 7, a clock signal CLK has repeated H levels (activated state) and L levels (inactivated state) in a prescribed cycle. An activation edges of clock signal CLK are shown respectively at times T0–T7. In FIG. 7, one data read operation or data write operation is carried out every two cycles, and therefore two-clock cycles of times T0–T2, T2–T4, T4–T6, and T6–T8 (not shown) will be referred to as cycles 91, 92, 93 and 94, respectively.

When an operational instruction to MRAM device 1 is issued, a chip select signal CS is activated to H level at a clock activation edge at the start of each cycle. At the time of a write command (a data write instruction) input, a command control signal WCMD is activated to H level along with chip select signal CS. Similarly, at the time of a read command (at the time of a data read) input, a command control signal RCMD is activated to H level along with chip select signal CS.

In each cycle, whether the decode mode is one-cell decode mode or two-cell decode mode is set in accordance with the level of mode control signal MDS at the clock activation edge corresponding to the start of the cycle.

At time T0 when cycle 91 is started, a write command is input and mode control signal MDS is at L level so that one-cell decode mode is instructed in which one selected memory cell corresponding to an input address is to be accessed. Furthermore, in order to specify one selected column, decode control signal SCD0 is set to H level and decode control signal SCD1 is set to L level. Decode control signal DCD is set to L level in accordance with mode control signal MDS, although not shown.

In cycle 91, a data write current flows through write digit line WDL in the selected row in response to the input of the write command, and input data DIN is latched at latch circuit 44 in the selected column as write data WD. A data write current in response to write data WD of the corresponding latch circuit 44 is supplied to bit line BL in the selected column. As a result, input data DIN is written into the one selected memory cell corresponding to the address input at time T0.

It is noted that the supply of the data write current to bit line BL is started at a timing after a ΔTw delay from the start of the supply of the data write current to write digit line WDL. By providing such a timing difference, it is possible to stabilize the operation to invert the magnetization direction of tunneling magneto-resistance element TMR in the selected memory cell. Specifically, a magnetic field in the direction of the hard axis from write digit line WDL is first applied to determine the rotation direction of each magnetic domain and a magnetic field in the direction of the easy axis from bit line BL is then applied to rotate the magnetization direction, so that the inversion operation described above can be stabilized.

Furthermore, slope TC1 at the time of the rise of the data write current flowing in write digit line WDL is set larger than slope TC2 at the time of the rise of the data write current flowing in bit line BL. Such a setting of slopes TC1 and TC2 is realized, for example, by setting the current driving ability of driver transistor 23 shown in FIG. 1 larger than the current driving ability of each of driver transistors 31, 32, 36, and 37 shown in FIG. 1.

Generally, if the change of the data write current flowing in bit line BL is excessive, the magnetic domain oscillates to prolong the unstabilized state at the end point of the rotation operation in each magnetic domain described above. Therefore, by making smaller the slope at the time of the rise of the data write current on bit line BL as described above, the inversion operation described above can be stabilized. The data write into the selected memory cell is stabilized by controlling the time at which the supplies of these data write currents are started.

At time T2 when cycle 92 is started, a read command is input and mode control signal MDS is set to L level, so that one-cell decode mode is instructed in a manner similar to cycle 91. Furthermore similar to cycle 91, decode control signal SCD0 is set to H level and decode control signal SCD1 is set to L level.

In cycle 92, in response to an address (not shown) input at time T2, read word line RWL in the selected row is activated to H level and a current and voltage corresponding to the stored data in the selected memory cell is generated in bit line BL in the selected column. As illustrated in FIG. 4, in one-cell decode mode, data is read based on the access to the selected memory cell through bit line BL in the selected column and the access to dummy memory cells DMC of electric resistances Rmax and Rmin. Therefore, at time T3 in the next clock cycle, output data DOUT (for example "H level") read from the selected memory cell can be output.

At time T4 when cycle 93 is started, a write command is input and mode control signal MDS is at H level so that two-cell decode mode is instructed in which two selected memory cells forming a pair are to be accessed. Responsively, each decode control signal SCD0, SCD1 is set to L level, and decode control signal DCD is set to H level, though not shown.

In cycle 93, in response to the input of the write command, a data write current flows in write digit line WDL in the selected row. Furthermore, as shown in FIG. 4, column select portion 27 allows data DIN and the inverted data thereof to be transmitted to latch circuits 44 and 44# in the two selected columns corresponding to the two selected memory cells, respectively. Latch circuits 44 and 44# latch the respective transmitted complimentary data as write data WD.

Bit lines BL and BL# respectively corresponding to the two selected columns are supplied with data write currents having directions in accordance with respective write data WD latched by the corresponding latch circuits 44 and 44#. As a result, complimentary data in accordance with input data DIN is written in parallel into the two selected memory cells corresponding to the address input at time T4.

It is noted that the setting of the supply starting timing and the slope at the time of the rise between the data write current supplied to bit lines BL, BL# and the data write current supplied to write digit line WDL is similar as illustrated in cycle 91 and therefore the detailed description thereof will not be repeated.

It is noted that although FIG. 7 shows the operational example where data writes into two selected memory cells are carried out in parallel in one clock cycle, these data writes can be divided and carried out in two clock cycles. In this case, while the data write current is supplied to write digit line WDL in the selected row in each of the two clock cycles, the data write current may be supplied to either one of bit lines BL and BL# in the respective two clock cycles.

When the data writes into two selected memory cells are carried out in parallel, the data write current flowing in bit line BL is locally concentrated to incur a momentary drop of the power supply voltage whereby the operational margin may be impaired. If these data writes can be divided and performed in two clock cycles, the current concentration can be avoided and the reduced operational margin can be avoided.

At time T6 when clock cycle 94 is started, a read command is input and mode control signal MDS is set to H level so that two-cell decode mode is instructed in a manner similar to cycle 93. Responsively, each decode control signal SCD0, SCD1 is set to L level and decode control signal DCD is set to H level, though not shown.

In cycle 94, in response to an address (not shown) input at time T6, read word line RWL in the selected row is activated to H level. Furthermore, as shown in FIG. 1, column select portion 27 allows bit lines BL and BL# in the two selected columns to connect to data read circuit 60 through read data lines RDL1 and RDL2, respectively.

As illustrated in FIG. 5, in two-cell decode mode, data is read based on the respective access to two selected memory cells storing data complimentary to each other through bit lines BL and BL# in the selected columns. Therefore at time T7 in the next clock cycle, output data DOUT (for example "L level") read from the selected memory cell is output.

In this way, in the configuration in accordance with the first embodiment, depending on the level of mode control signal MSD, the access to the memory cell in reading data and writing data can be switched between one-cell decode mode and two-cell decode mode. In other words, in the common array configuration, the number of memory cells required for storing one bit can be switched depending on the level of the electrical signal.

In addition, it is possible to provide an operational region in one-cell decode mode and an operational region in two-cell decode mode in the same memory cell array by associating the address with the mode control signal appropriately. As a result, the nonvolatile memory device in accordance with the first embodiment of the present invention can flexibly handle both an application having a priority in a data capacity and an application having a priority in data reliability without changing the array configuration.

As to the border between these operational regions, in particular, the setting can be switched by the setting of mode control signal and the address in a software manner without changing the array configuration. Therefore, the nonvolatile memory device in accordance with the first embodiment of the present invention can realize a flexible operation in such a manner as to increase the operational region in one-cell decode mode when a data capacity is required and to increase the operational region in two-cell decode mode when data reliability is required.

Furthermore, dummy memory cell DMC has characteristics (configuration and shape) similar to those of normal memory cell MC, so that a special design or manufacturing process for fabricating a dummy memory cell becomes unnecessary and dummy memory cells DMC can be configured using a part of MTJ memory cells formed successively. Therefore, the dummy memory cell can be manufactured without problems such as an increased chip area and a reduced process margin of the memory cell array because of a complicated manufacturing process. Specifically, the continuity of the configuration within memory cell array 10 can be ensured, thereby contributing to the stabilization of the characteristics of memory cell MC and dummy memory cell DMC.

In addition, even in one-cell decode mode having a relatively poor data read accuracy, data can be read with reference to dummy memory cells respectively having the characteristics similar to those of memory cells MC respectively storing H level and L level, and therefore the data read accuracy can be improved.

First Modification of First Embodiment

In a first modification of the first embodiment, a configuration for suppressing the offset of the sense amplifier in the data read circuit and particularly for increasing the accuracy of the data read in one-cell decode mode will be described.

Figure 8:
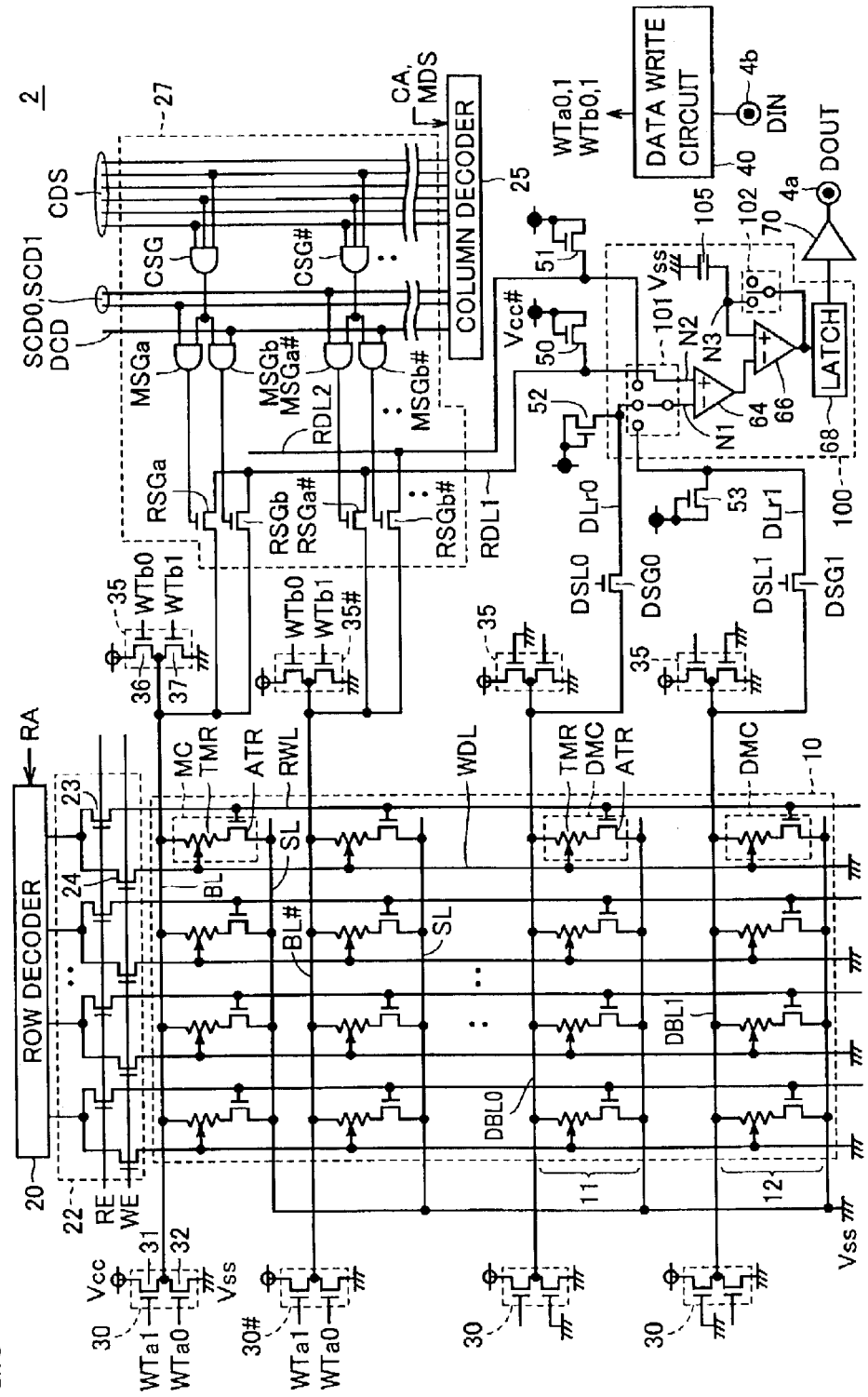
FIG. 8 is a circuit diagram illustrating a configuration of an MRAM device shown as a representative example of a nonvolatile memory device in accordance with a first modification of the first embodiment of the present invention.

Referring to FIG. 8, an MRAM device 2 in accordance with the first modification of the first embodiment differs from MRAM device 1 in accordance with the first embodiment shown in FIG. 1 in that it includes a data read circuit 100 in place of data read circuit 60.

Data read circuit 100 has sense amplifiers 64 and 66, a latch circuit 68, switches 101 and 102, and a voltage holding capacitor 105.

Switch 101 selectively connects one of read data line RDL2, reference data lines DLr0 and DLr1 to node N1. Node N2 is connected with read data line RDL1. Switch 102 is provided for connecting or non-connecting the output node of sense amplifier 66 to node N3. Voltage holding capacitor 105 is connected between node N3 and ground voltage Vss for holding the voltage level at node N3.

Sense amplifier 64 outputs an output voltage obtained by amplifying the current difference (or a voltage difference) between node N1 and N2. Sense amplifier 66 amplifies the voltage difference between the voltage at node N3 and the output voltage of sense amplifier 64. Latch circuit 68 latches the output voltage of sense amplifier 66 for generating read data at a prescribed timing after the start of the data read.

The remaining configuration of MRM device 2 is similar to that of MRAM device 1 shown in FIG. 1 and the detail description thereof will not be repeated.

Figure 9:
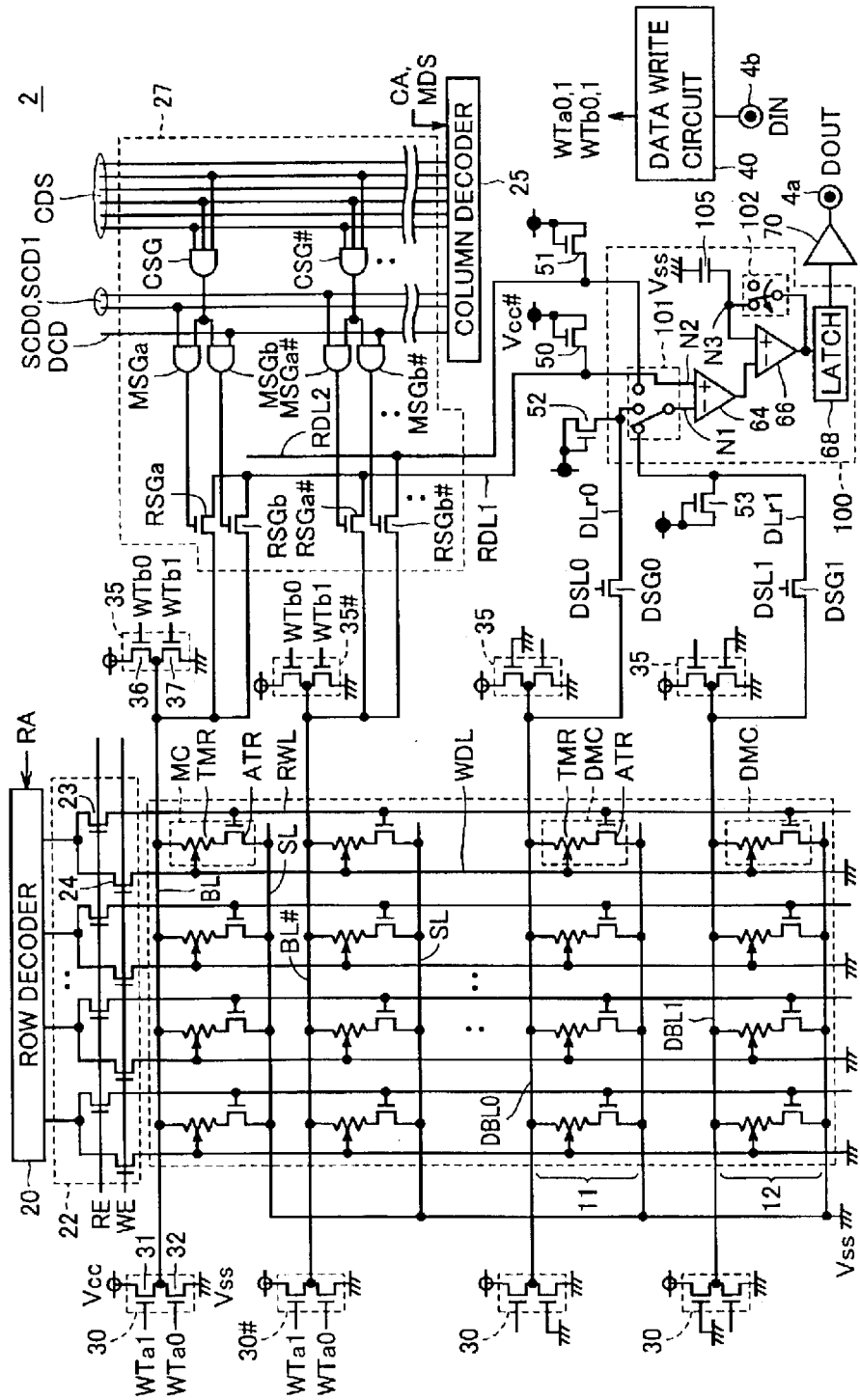
FIG. 9 is a first circuit diagram illustrating a data read operation in one-cell decode mode in the MRAM device in accordance with the first modification of the first embodiment.
Figure 10:
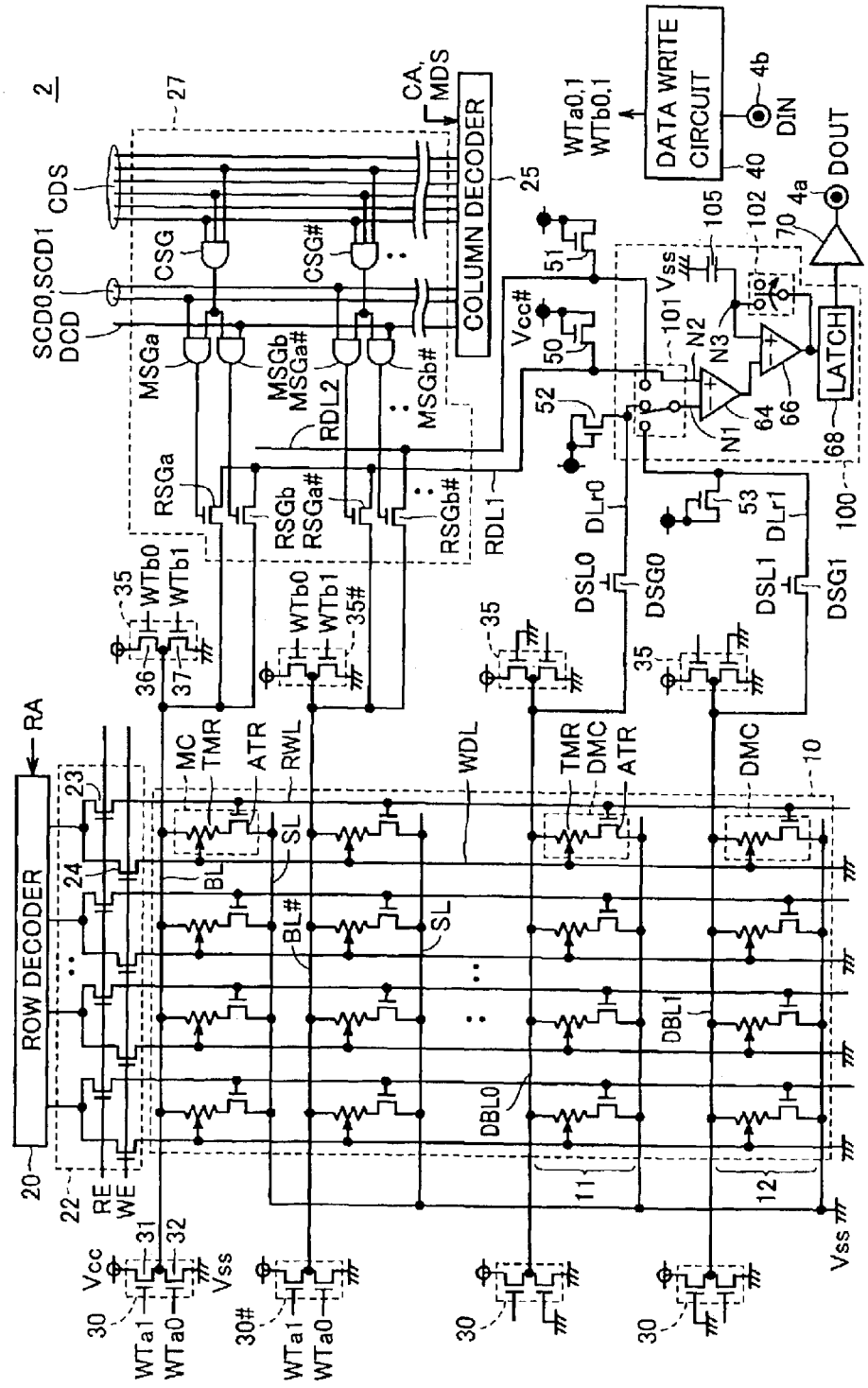
FIG. 10 is a second circuit diagram illustrating the data read operation in one-cell decode mode in the MRAM device in accordance with the first modification of the first embodiment.

FIGS. 9 and 10 are circuit diagrams illustrating the data read operation in one-cell decode mode in the MRAM device in accordance with the first modification of the first embodiment. In the MRAM device in accordance with the first modification of the first embodiment, the data read in one-cell decode mode is divided and performed in a two-stage operation.

Referring to FIG. 9, in the first half of the data read in one-cell decode mode, switch 101 first connects node N1 to one of reference data lines DLr0 and DLr1 (here DLr1). Switch 102 connects the output node of sense amplifier 66 to node N3.

In a similar manner as illustrated in the first embodiment, in the data read in one-cell decode mode, dummy memory cells DMC allow respective currents and voltages corresponding to electric resistances Rmax and Rmin to be generated in reference data lines DLr0 and DLr1.

Furthermore, a current and voltage in accordance with the electric resistance (Rmax or Rmin) of the selected memory cell is created in read data line RDL1.

In the state shown in FIG. 9, sense amplifier 64 generates an output voltage based on a comparison between the results of the respective access to the selected memory cell and dummy memory cell DMC (electric resistance Rmin). Through a feedback loop of sense amplifier 66 formed by switch 102, the read result in this state is held by voltage holding capacitor 105 as a voltage at node N3.

Referring to FIG. 10, the connections at switches 101 and 102 are switched at a timing when a prescribed period has passed after the start of the data read. Specifically, in the latter half of the data read in one-cell decode mode, switch 101 connects node N1 to the other of reference data lines DLr0 and DLr1 (here DLr0), and switch 102 isolates the output node of sense amplifier 66 from node N3.

In the state shown in FIG. 10, sense amplifier 64 generates an output voltage based on a comparison of the results of the respective access to the selected memory cell and the dummy memory cell (electric resistance Rmax). On the other hand, at node N3, a voltage based on the read result in the state shown in FIG. 9, that is, a voltage based on a comparison of the results of the respective access to the selected memory cell and the dummy memory cell (electric resistance Rmin) is held by voltage holding capacitor 105.

As a result, since the output voltage of sense amplifier 66 in the state of FIG. 10 has different polarities depending on the stored data in the selected memory cell, output data DOUT can be generated by latching the output voltage of sense amplifier 66 at a timing in consideration of the time required for the amplifying operations of sense amplifiers 64 and 66.

Figure 11:
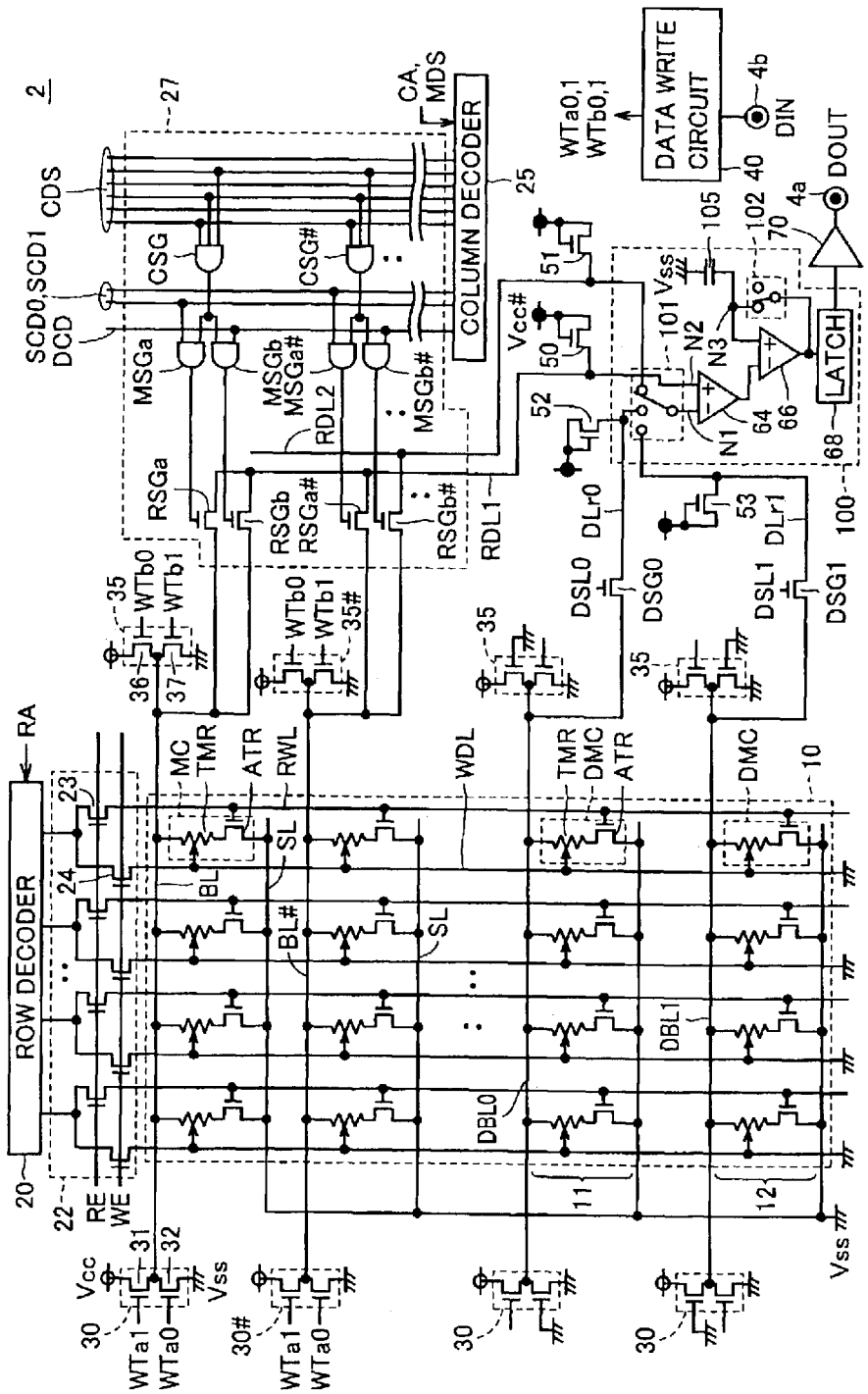
FIG. 11 is a circuit diagram illustrating a data read operation in two-cell decode mode in the MRAM device in accordance with the first modification of the first embodiment.

FIG. 11 is a circuit diagram illustrating the data read operation in two-cell decode mode in the MRAM device in accordance with the first modification of the first embodiment.

Referring to FIG. 11, in the data read in two-cell decode mode, switch 101 connects node N1 to read data line RDL2 and switch 102 connects the output node of sense amplifier 66 to node N3.

As described before, in the data read in two-cell decode mode, two selected memory cells storing complimentary data are connected respectively to read data lines RDL1 and RDL2. Therefore, in the state of FIG. 11, sense amplifier 64 can generate a voltage in accordance with the level of the stored data to be read based on the access to the two selected memory cells.

The output voltage of sense amplifier 64 is further amplified by the feedback loop formed by switch 102. In other words, the data read in two-cell decode mode does not have to be divided and performed in two stages as in the data read in one-cell decode mode. Specifically, read data from the selected memory cell can be generated by latching the output voltage of sense amplifier 66 at a prescribed timing in consideration of the time required for the amplifying operations of sense amplifiers 64 and 66, in the state of FIG. 11.

As a result, in the data read circuit 60 in accordance with the first embodiment, the comparison of the access results between the selected memory cell and the respective dummy memory cells having two kinds of electric resistances is performed in the separate sense amplifiers 64 and 65 whereas in data read circuit 100 in accordance with the first modification of the first embodiment, the access comparison between the selected memory cell and the respective dummy memory cells having two kinds of electric resistances is performed by the common sense amplifier 64. Therefore a data read accuracy can be improved while suppressing the offset caused by variations between the sense amplifier elements.

Figure 12:
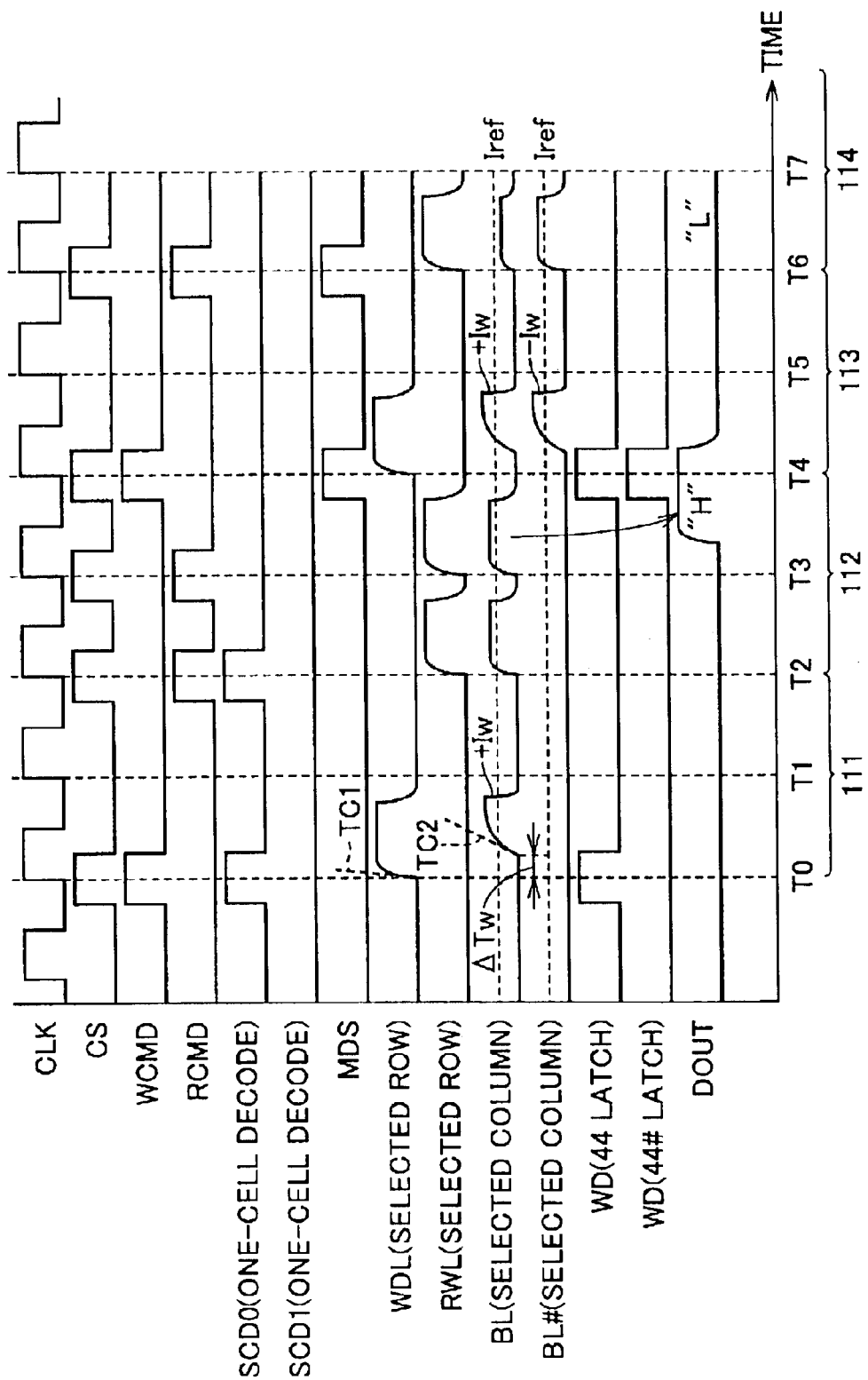
FIG. 12 is an operation waveform diagram illustrating data read and data write operations in the MRAM device shown in FIG. 8.

FIG. 12 is an operation waveform diagram illustrating the operation of the MRAM device in accordance with the first modification of the first embodiment.

Referring to FIG. 12, similar to FIG. 7, the activation edges of clock signal CLK having a prescribed cycle are shown respectively at times T0–T7, and the two-clock cycles for carrying out one data read or data write are respectively represented by cycles 111–114.

Referring to FIG. 12, at time T0 when cycle 111 is started, in a manner similar to FIG. 7, a data write in one-cell decode mode is instructed. Therefore, similar to cycle 91 shown in FIG. 7, in accordance with an address input at time T0, data write currents flow respectively in write digit line WDL in the selected row and bit line BL in the selected column. In cycle 111, input data DIN (write data WD) input at time T0 and latched by latch circuit 44 is written into one selected memory cell.

At time T2 when cycle 112 is started, in a manner similar to FIG. 7, the data read in one-cell decode mode is instructed. In the first half of cycle 112 (times T2–T3), the operational state shown in FIG. 9 is realized, the access to the selected memory cell is carried out in response to the activation of read word line RWL in the selected row, and a current and voltage in accordance with the electric resistance (Rmax or Rmin) of the selected memory cell is generated in bit line BL in the selected column. Furthermore, the access to the dummy memory cell having one of two kinds of electric resistances (for example Rmin) is carried out in parallel, and a voltage indicative of the comparison result of the access is held at node N3 in data read circuit 100.

In the latter half of the clock cycle (times T3–T4), the operational state shown in FIG. 10 is realized, the access to the selected memory cell is carried out in a manner similar to the first half of the clock cycle while the access to the dummy memory cell having the other of two kinds of electric resistances (for example Rmax) is carried out in parallel. In data read circuit 100, the voltage held at node N3 that is based on the access comparison result in the first half of the clock cycle is compared with the voltage based on the access result obtained in the latter half of the clock cycle. Therefore in cycle 112, stored data in one selected memory cell can be read out. As a result, at time T4 in the next clock cycle, output data DOUT (for example "H level") read from the selected memory cell can be output.

At time T4 when cycle 113 is started, in a manner similar to FIG. 7, the data write in two-cell decode mode is instructed. The operation in cycle 113 is similar to that in cycle 93 shown in FIG. 7 and the detail description thereof will not be repeated.

At time T4 when the next cycle 114 is started, in a manner similar to FIG. 7, the data read in two-cell decode mode is instructed. As illustrated in cycle 112, the data read does not have to be divided and performed in two stages as in one-cell decode mode. Therefore, in cycle 114, in the first clock cycle (times T6–T7), data can be read based on the access to the two selected memory cells respectively storing complimentary data, that is, based on the current difference (or voltage difference) between the selected bit lines BL and BL# respectively connected to the two selected memory cells. Therefore, at time T7 in the next clock cycle, output data DOUT (for example "L level") can be output.

Second Modification of First Embodiment

In a second modification of the first embodiment, a configuration for improving a data read accuracy in one-cell decode mode is also shown.

Figure 13:
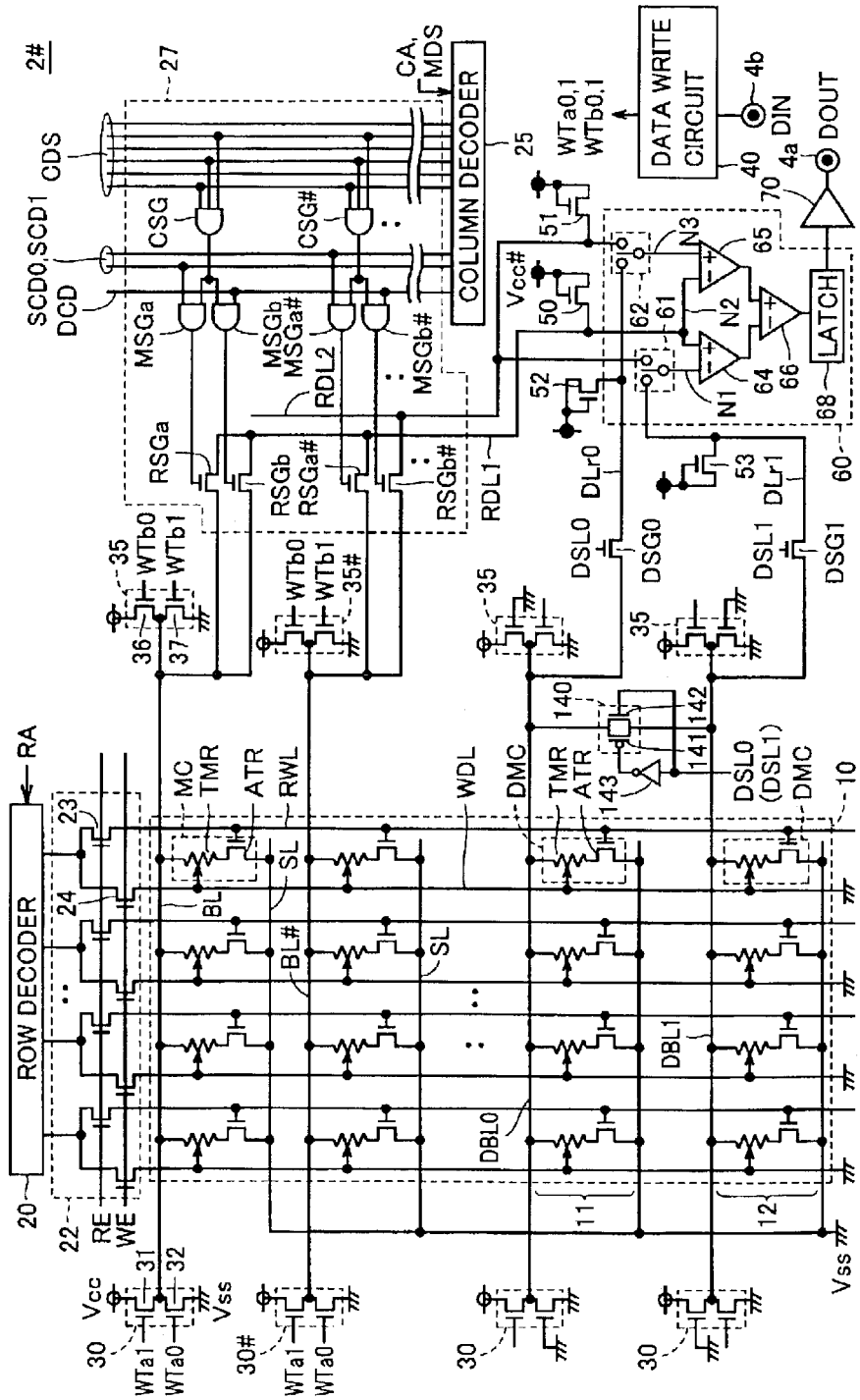
FIG. 13 is a circuit diagram illustrating a configuration of an MRAM device shown as a representative example of a nonvolatile memory device in accordance with a second modification of the first embodiment of the present invention.

Referring to FIG. 13, an MRAM device 2# in accordance with the second modification of the first embodiment differs from MRAM device 1 in accordance with the first embodiment shown in FIG. 1 in that it further includes a short-circuit switch 140. Short-circuit switch 140 has a P-channel MOS transistor 141 and an N-channel MOS transistor 142 connected in parallel between dummy bit lines DBL0 and DBL1.

The gate of transistor 142 receives a dummy select signal DSL0 (or DSL1), and the gate of transistor 141 receives dummy select signal DSL0 (or DSL1) inverted by inverter 143. Therefore, at the time of dummy select gates DSG0 and DSG1 turning on, short-circuit switch 141 is rendered conductive to make a short circuit between dummy bit lines DBL0 and DBL1.

The voltages and the passing currents of dummy bit lines DBL0 and DBL1 are thereby averaged. As a result, a current and voltage at the intermediate level of electric resistances Rmin and Rmax, that is, in a state where an electric resistance of (Rmax+Rmin)/2 is connected is generated in dummy bit lines DBL0 and DBL1. As a result, the current and the voltage corresponding to the electric resistance at the intermediate level are generated in each of reference data lines DLr0 and DLr1.

The remaining configuration and operation is similar to that in MRAM device 1 in accordance with the first embodiment and therefore the detail description thereof will not be repeated.

With such a configuration, in data read circuit 60, in reading data in one-cell decode mode, sense amplifier 64 and 65 compare read data line RDL1 having the voltage/current created in accordance with the electric resistance (Rmax or Rmin) of the selected memory cell with reference data lines DLr0 and DLr1 each having the current/voltage created in accordance with the electric resistance at the intermediate level. As a result, amplitudes having different polarities depending on the stored data of the selected memory cell are created in the outputs of sense amplifiers 64 and 65. Therefore, even when a sufficient amplitude cannot be obtained in one of the sense amplifiers because of variations of elements between sense amplifiers 64 and 65, data can be read normally if a sufficient amplitude can be obtained in the other sense amplifier. Therefore the accuracy of data read can be improved.

The data read operation in two-cell decode mode, and the data write operations in one-cell decode mode and in two-cell decode mode are similar as illustrated in the first embodiment and the detail description thereof will not be repeated.

Second Embodiment

In the first embodiment and the first and second modifications thereof, the array configuration in which the dummy memory cells are arranged to form a dummy cell column is shown. In a second embodiment, a configuration in which the dummy memory cells are arranged to form a dummy cell row will be described.

Figure 14:
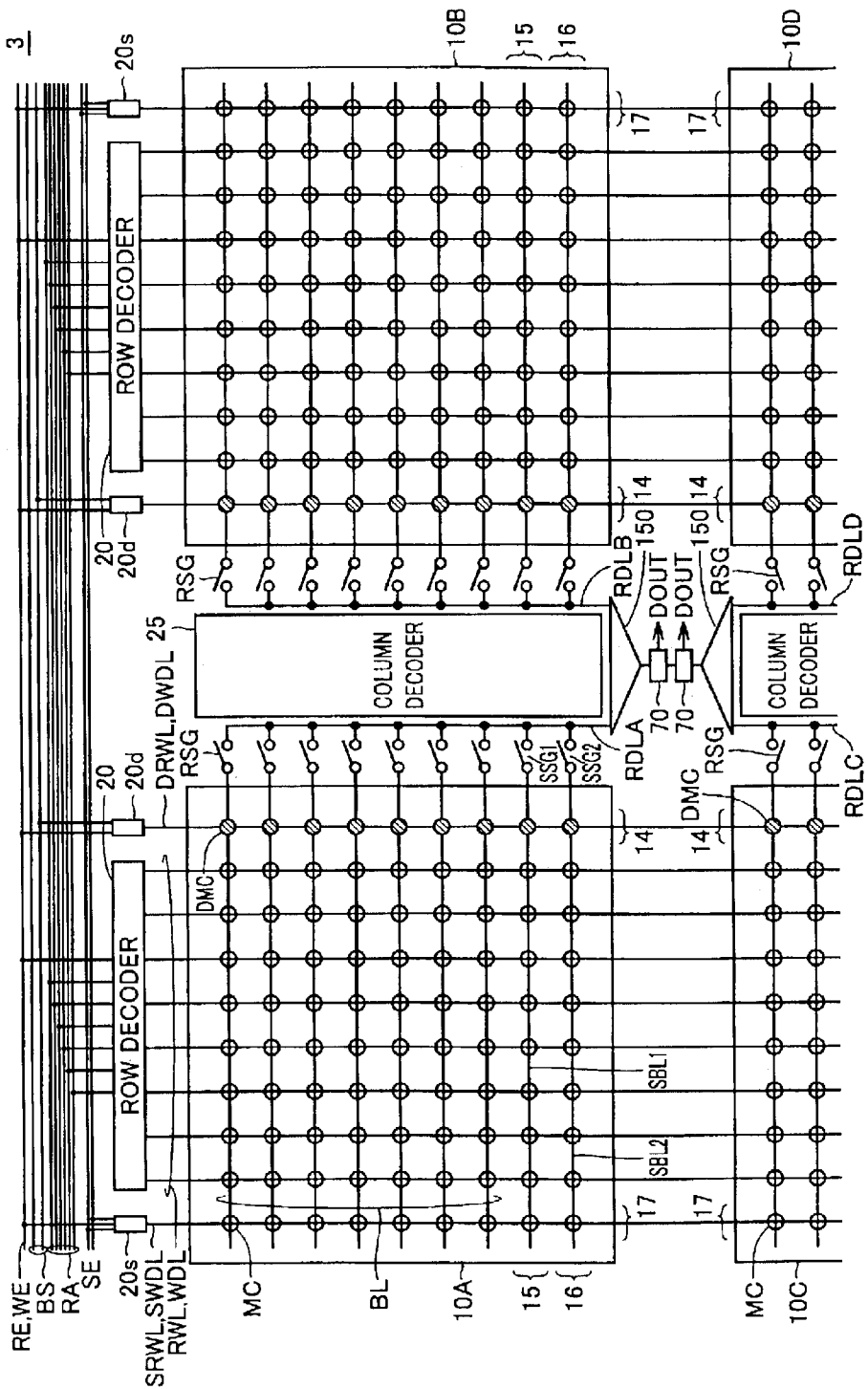
FIG. 14 is a schematic block diagram illustrating an entire configuration of an MRAM device shown as a representative example of a nonvolatile memory device in accordance with a second embodiment of the present invention.

Referring to FIG. 14, an MRAM device 3 in accordance with the second embodiment includes a plurality of memory cell blocks 10A, 10B, 10C and 10D.

Each of memory cell blocks 10A, 10B, 10C and 10D has a similar configuration and has a plurality of MTJ memory cells arranged in a matrix. At least one row of MTJ memory cells is used as dummy memory cells DMC. Dummy memory cells DMC are arranged to form dummy cell row 14. Dummy memory cell DMC has data written beforehand corresponding to electric resistance Rmin and stores the data fixedly.

The remaining MTJ memory cells are used as normal memory cells MC except that memory cell columns 15 and 16 at the end portion are used as spare columns, and at least one memory cell row is used as a spare row 17. Spare columns 15 and 16 each have both normal memory cells MC and dummy memory cell DMC and therefore these can be replaced. Although spare row 17 is formed with only normal memory cells MC, memory cells MC and dummy memory cells DMC have the same configuration as in the first embodiment, and they are different in whether they hold prescribed data (electric resistance Rmin) fixedly. Therefore, either of the memory cell MC row and dummy cell row 14 can be replaced with spare row 17.

Read word lines RWL and write digit lines WDL are arranged corresponding to respective memory cell MC rows, and dummy read word line DRWL and dummy write digit line DWDL are provided corresponding to dummy cell row 14. Similarly, spare read word line SRWL and spare write digit line SWDL are provided for spare row 17.

Row decoder 20 generates a row decode signal (not shown) for selectively activating read word line RWL and write digit line WDL in accordance with row address RA.

A dummy decoder 20d controls the activation of dummy read word line DRWL in reading data in accordance with a block select signal BS.

A spare decoder 20s controls the activation of spare read word line SRWL and spare write digit line SWDL in reading data and writing data, respectively, in response to a spare enable signal SE.

Bit lines BL are provided corresponding to respective memory cell MC columns, and spare bit lines SBL1 and SBL2 are provided corresponding to spare columns 15 and 16, respectively. Each of bit lines BL, spare bit lines SBL1 and SBL2 is shared by memory cells MC and dummy memory cells DMC. Furthermore, read data lines RDLA, RDLB, RDLC, and RDLD are provided corresponding to memory cell blocks 10A, 10B, 10C and 10D, respectively.

In each of memory cell blocks 10A, 10B, 10C and 10D, a corresponding one of read data lines RDLA, RDLB, RDLC, and RDLD, and a read select gate RSG for controlling the connection between bit lines are arranged. Spare select gate SSG1, SSG2 is provided between read data line RDLA, RDLB, RDLC, RDLD and spare bit line SBL1, SBL2.

As will be described later in detail, two of a plurality of memory cell blocks form a pair. For example, memory cell blocks 10A and 10B form a pair. Memory cell blocks 10C and 10D also form a pair similar to memory cell blocks 10A and 10B.

In two-cell decode mode, one-bit data is stored in two memory cells corresponding to the same address that are included in the respective one of paired two memory cell blocks. One memory cell in the selected memory cell block and one memory cell included in a memory cell block paired with the selected memory cell block are to be accessed to allow complimentary data to be written therein. Also in reading data, the respective ones of memory cells are to be accessed.

On the other hand, in one-cell decode mode, one-bit data is stored in each memory cell in each memory cell block. Specifically, in writing data, one selected memory cell in a selected memory cell block is to be accessed to allow data to be written therein, and in reading data, that one selected memory cell and a dummy memory cell DMC in the non-selected memory cell block paired with a selected memory cell-block are to be accessed.

Column decoder 25 and data read circuit 150 are shared between paired memory cell blocks for example between memory cell blocks 10A and 10B.

The signal lines for performing a row select as represented by read word line RWL and write digit line WDL are arranged to extend to be shared between a plurality of memory cell blocks. More specifically, in memory cell blocks 10A and 10C, a row select in reading data and writing data is carried out by the common read word line RWL, write digit line WDL, dummy read word line DRWL, dummy read word line DRWL, spare read word line SRWL, and spare write digit line SWDL. Similarly, also in memory cell blocks 10B and 10D, a row select in reading data and writing data is carried out by the common signal lines.

In reading data, in one-cell decode mode, read word line RWL corresponding to the selected row in the selected memory cell block is activated to H level, and dummy read word line DRWL in the non-selected memory cell block paired with the selected memory cell block is activated. In two-cell decode mode, in each of the paired two memory cell blocks, read word line RWL corresponding to the selected row is activated to H level.

In writing data, in one-cell decode mode, write digit line WDL corresponding to the selected row in the selected memory cell block is activated to H level, and in two-cell decode mode, in each of the paired, two memory cell blocks, write digit line WDL corresponding to the selected row is activated to H level.

If the selected row includes a defective memory cell, spare read word line SRWL and spare write digit line SWDL are activated in place of read word line RWL and write digit line WDL, respectively, in reading data and writing data, respectively.

Figure 15:
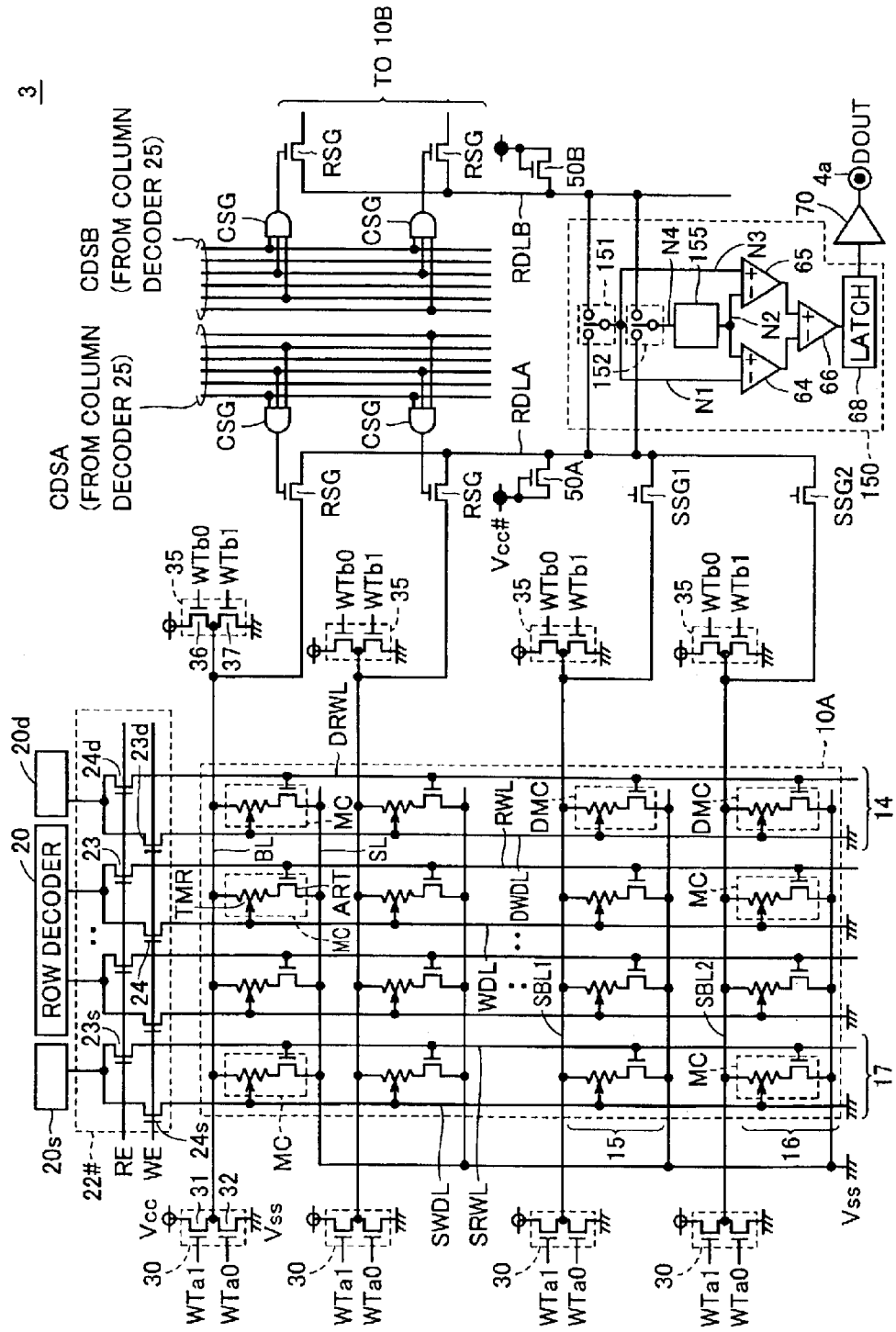
FIG. 15 is a circuit diagram illustrating data read and data write configurations in the MRAM device shown in FIG. 14.

FIG. 15 is a circuit diagram illustrating the data read and data write configurations in the MRAM device shown in FIG. 14. In FIG. 15, memory cell block 10A and the configuration corresponding thereto are representatively shown.

Memory cell block 10A, as illustrated in FIG. 14, is formed of a plurality of MTJ memory cells and has dummy memory cells DMC forming dummy cell row 14, spare columns 15 and 16, and spare row 17 in addition to normal memory cells MC.

The configuration of row select portion 22 is similar to that of row select portion 22 shown in FIG. 1, with driver transistors 23d and 24d connected between dummy decoder 20d and dummy read word line DRWL and dummy write digit line DWDL, respectively. For spare row 17, driver transistors 23d and 24d are connected between spare decoder 20s and spare read word line SRWL and spare write digit line SWDL, respectively. Each gate of driver transistors 23, 23d, and 23s receives control signal RE, and the gate of driver transistor 24, 24d, 24s receives control signal WE.

The configuration for a data write will now be described.

Bit line drivers 30 and 35 similar to those in FIG. 1 are arranged corresponding to each of bit line BL, spare bit lines SBL1 and SBL2. The operation of bit line drivers 30 and 35 is similar as illustrated in the first embodiment and the detailed description thereof will not be repeated. It is noted that although not shown, a data write circuit generating write control signals WTa0, WTa1, WTb0, and WTb1 set for each memory cell column is provided in a manner similar to FIG. 1.

In writing data in one-cell decode mode, the respective data write currents flow in write digit line WDL in the selected row and bit line BL (or spare bit line SBL1, SBL2) in the selected column so that data is written in one selected memory cell.

On the other hand, in writing data in two-cell decode mode, in parallel with input data written into one selected memory cell in memory cell block 10A in a manner similar to one-cell decode mode, inverted data of the input data is written into one selected memory cell specified by the same address also in the paired memory cell block 10B.

The configuration for a data read will now be described.

Current supply transistors 50A and 50B are provided corresponding to read data lines RDLA and RDLB, respectively. The operation and function of current supply transistors 50A and 50B is similar to that of each of current supply transistors 50–53 shown in FIG. 1, and the detail description thereof will not be repeated.

Read select gate RSG provided corresponding to each memory cell column turns on/off in response to the output signal of the corresponding column select portion CSG. The output of each column select portion CSG is set in accordance with column decode signal CDSA, CDSB independently generated for each pair of memory cell blocks. In one-cell decode mode, the read select gate corresponding to the selected column in the selected memory cell block turns on, and bit line BL in the selected column is connected to read data line RDLA (or RDLB).

In two-cell decode mode, read select gate RSG corresponding to the selected column turns on in each of the paired memory cell blocks 10A and 10B. Read data lines RDLA and RDLB are thereby connected to the respective bit lines BL selected in memory cell blocks 10A and 10B.

If a memory cell column including a defective memory cell is selected, spare select gate SSG1 or SSG2 is turned on in place of read select gate RSG. As a result, in one-cell decode mode, in the selected memory cell block, spare bit line SBL1 or SBL2 is connected to read data line RDLA (or RDLB) in place of bit line BL in the defective memory cell column. On the other hand, in two-cell decode mode, in the selected memory cell block and the memory cell block paired therewith, spate bit line SBL1 or SBL2 is connected to read data lines RDLA and RDLB in place of bit line BL in the defective memory cell column.

The similar configuration is provided corresponding to each of memory cell blocks 10A and 10B, though partially not shown.

A data read circuit 150 shared between the paired memory cell blocks 10A and 10B includes sense amplifiers 64–66, a latch circuit 68, switches 151 and 152, and a reference resistance applying circuit 155.

Switch 151 selectively connects one of read data lines RDLA and RDLB to each of node N1 and node N3. Switch 152 selectively connects one of read data lines RDLA and RDLB to node N4. Reference resistance applying circuit 155 is provided between nodes N2 and N4.

Figure 16:
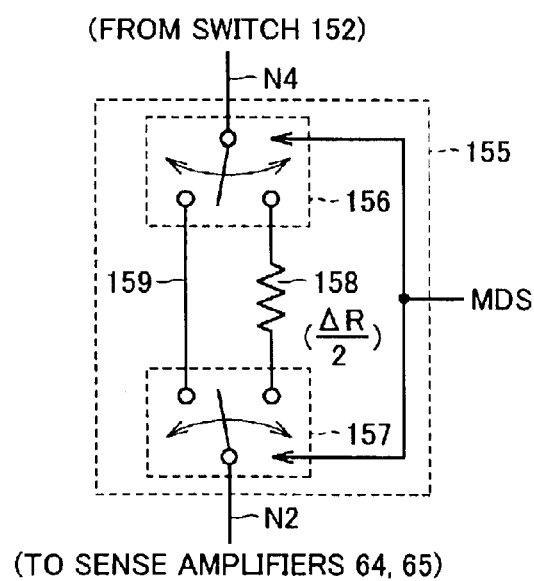
FIG. 16 is a circuit diagram illustrating a configuration of a reference resistance applying circuit shown in FIG. 15.

Referring to FIG. 16, reference resistance applying circuit 155 has switches 156 and 157, a reference resistor 158, and a bypass path 159. Switches 156 and 157 switch the connection between nodes N2 and N4 in response to mode control signal MDS.

Specifically, in one-cell decode mode, switches 156 and 158 connect nodes N2 and N4 through reference resistor 158. Reference resistor 157 has an electric resistance smaller than $\Delta R$, preferably an electric resistance $\Delta R/2$ ($\Delta R$=Rmax−Rmin). As a result, the sum of electric resistances of dummy memory cell DMC and reference resistor 158 will be (Rmin+$\Delta R$/2), which is an intermediate level of the two kinds of electric resistances Rmin and Rmax of the selected memory cell.

On the other hand, in two-cell decode mode, switches 156 and 158 connect nodes N2 an N4 through bypass path 159. The electric resistance of bypass path 159 is ideally zero.

The operation of sense amplifiers 64–66 and latch circuit 68 is similar to that in data read circuit 60 shown in FIG. 1, and the detailed description thereof will not be repeated.

Figure 17:
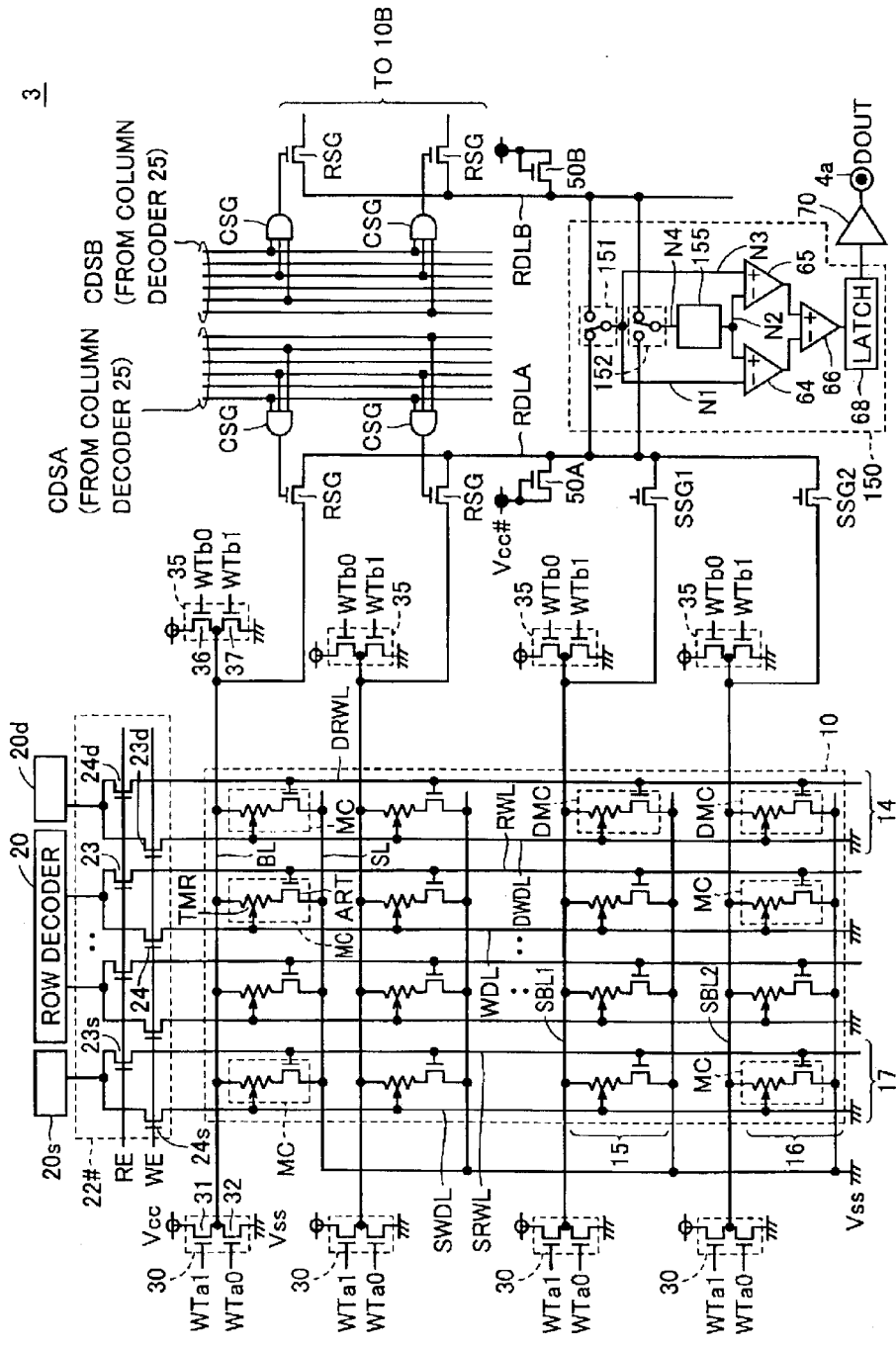
FIG. 17 is a circuit diagram illustrating a data read operation in one-cell decode mode in the MRAM device in accordance with the second embodiment.

Referring to FIG. 17, the data read in one-cell decode mode will now be described.

As described before, in one-cell decode mode, one of the paired memory cell blocks 10A and 10B includes a memory cell from which data is read as a selected memory cell block. Switch 151 connects that one of read data lines RDLA and RDLB which corresponds to the selected memory cell block to each of nodes N1 and N3. Switch 152 connects the other of read data lines RDLA and RDLB that corresponds to the non-selected block to node N4. When memory cell block 10A is selected, for example, switch 151 connects read data line RDLA to each of nodes N1 and N3, and switch 152 connects read data line RDLB to node N4.

As a result, each of nodes N1 and N3 is coupled to the selected memory cell, and node N2 is connected to dummy memory cell DMC in the non-selected memory cell block through reference resistor 158 in reference resistance applying circuit 155.

As a result, sense amplifiers 64 and 65 amplify and output the comparison result between the access to the selected memory cell having electric resistance Rmax or Rmin and the access to the dummy memory cell in the respective opposite polarities.

As described above, the electric resistance of the access path to the dummy memory cell is set at the intermediate level of Rmax and Rmin. As a result, based on the access to the selected memory cell in the selected memory cell block and to the dummy memory cell in the non-selected memory cell block, data can be read in one-cell decode mode.

The data read in two-cell decode mode will now be described.

In two-cell decode mode, in each of memory cell blocks 10A and 10B, read word line RWL (or spare read word line SRWL) corresponding to an input address is activated, so that two selected memory cells storing respective data complimentary to each other are connected to read data lines RDLA and RDLB.

Switch 151 connects read data line RDLA to each of nodes N1 and N3, and switch 152 connects read data line RDLB to node N4. Therefore, nodes N1 and N3 are electrically coupled to the selected memory cell in memory cell block 10A, and node N2 is electrically coupled to the selected memory cell in memory cell block 10B.

In two-cell decode mode, since reference resistance applying circuit 155 connects nodes N2 and N4 through bypass path 159, no new electric resistance is applied between nodes N2 and N4. Therefore, sense amplifiers 64 and 65 can output electrical signals produced by amplifying the electric resistance difference between two selected memory cells storing respective complimentary data in the respective opposite characteristics. As a result, data read circuit 150 can carry out a data read based on the access to the two selected memory cells respectively belonging to the paired memory cell blocks.

In this way, also in the MRAM device in accordance with the second embodiment, the access to a memory cell in reading data and writing data can be switched between one-cell decode mode and two-cell decode mode in accordance with the level of mode control signal MDS that is an electrical signal. In other words, in the common array configuration, the number of memory cells required for storing one bit can be switched in accordance with the level of the electrical signal. In addition by associating the address with the mode control signal appropriately, it is possible to provide an operational region in one-cell decode mode and an operational region in two-cell decode mode within the same memory cell array.

As a result, similar to the nonvolatile memory device in accordance with the first embodiment, it is possible to flexibly handle both an application having a priority in a data capacity and an application having a priority in data reliability without changing the array configuration, and in addition, the respective operational regions in one-cell decode mode and in two-cell decode mode can be adjusted flexibly depending on the application.

Furthermore, similar to the nonvolatile memory device in accordance with the first embodiment, dummy memory cell DMC has the configuration and shape similar to that of the normal memory cell MC, thereby contributing to a simplified manufacturing process and stabilized characteristics of memory cell MC and dummy memory cell DMC.

In addition, in the configuration in accordance with the second embodiment, since the selected memory cell and the dummy memory cell respectively belonging to different memory cell blocks are to be accessed in one-cell decode mode, in each memory cell block having dummy cell row 14, a higher integration in each memory array can be achieved by arranging a normal memory cell MC on each cross point of read word line RWL and bit line BL without incurring complicated control of the connection of memory cell MC and dummy memory cell DMC to bit line BL (and spare bit line SBL1, SBL2) in accordance with an input address.

Modification of Second Embodiment

In a modification of the second embodiment, a configuration for accessing two memory cells within the same memory cell block in two-cell decode mode will be described as a modified version of the MRAM device in accordance with the second embodiment.

Figure 18:
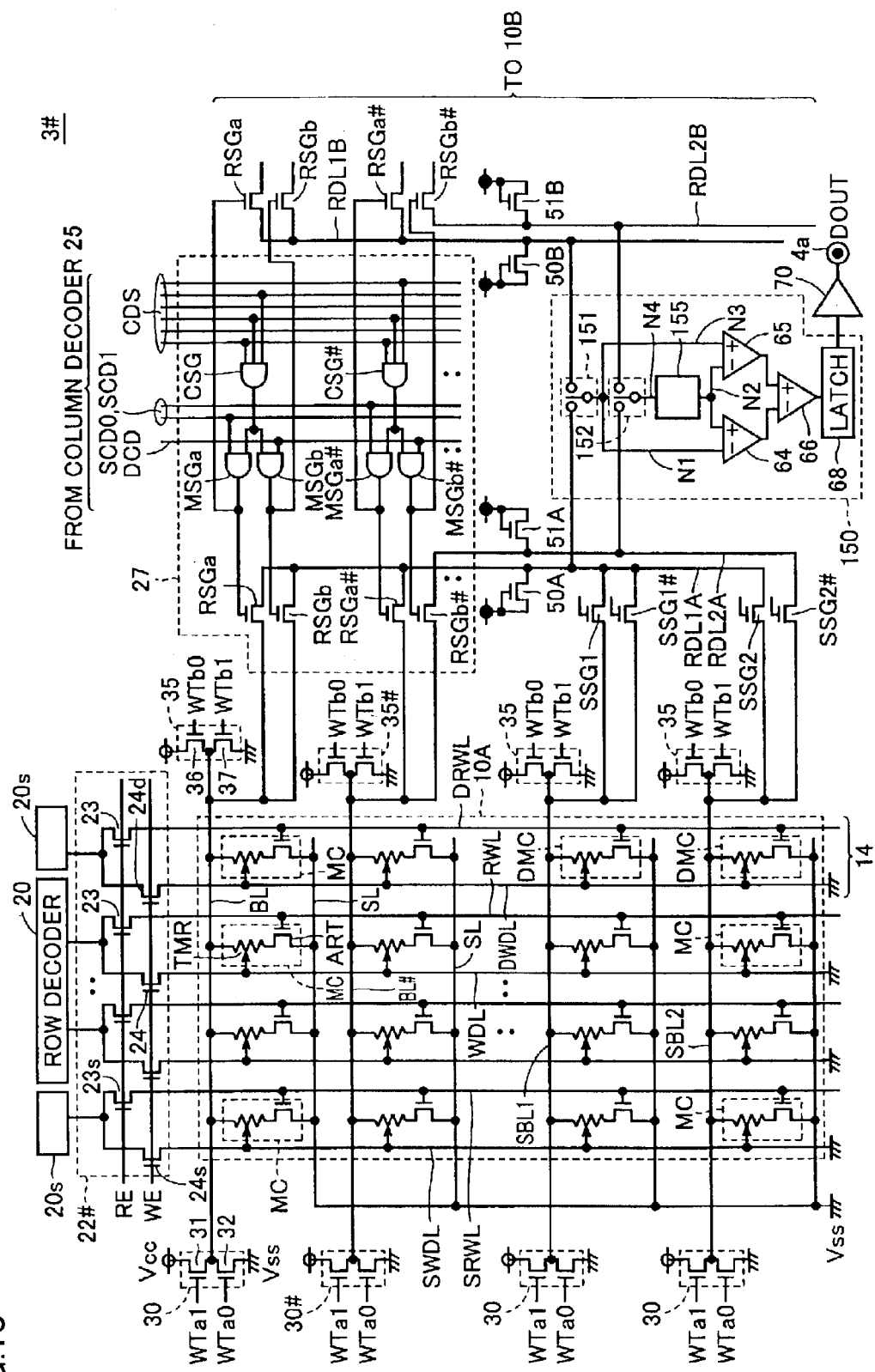
FIG. 18 is a circuit diagram illustrating an entire configuration of an MRAM device shown as a representative example of a nonvolatile memory device in accordance with a modification of the second embodiment of the present invention.

FIG. 18 is a circuit diagram showing a configuration of an MRAM device 3# in accordance with the modification of the second embodiment.

Referring to FIG. 18, MRAM device 3# differs from MRAM device 3 in accordance with the second embodiment shown in FIG. 15 in that two read data lines are arranged corresponding to each memory cell block and in that a column select portion in each memory cell block is realized by column select portion 27 shown in FIG. 1.

For example, read data lines RDL1A and RDL2A are arranged corresponding to memory cell block 10A, and read data lines RDL1B and RDL2B are provided corresponding to memory cell block 10B. Current supply transistors 50A and 51A are provided corresponding to read data lines RDL1A and RDL2A, respectively, and current supply transistors 50B and 51B are provided corresponding to read data lines RDL1B and RDL2B, respectively. Each of current supply transistors 50A, 51A, 50B, and 51B has a configuration and function similar to that of each of current supply transistors 50–53 shown in FIG. 1.

In each memory cell block, the connection of two read data lines (for example RDL1A, RDL2A) with bit line BL in each memory cell column is configured in a manner similar to MRAM device 1 shown in FIG. 1. More specifically, column select portion 27 shown in FIG. 1 is arranged to be shared between the paired, two memory cell blocks, for example, between memory cell blocks 10A and 10B.

In each memory cell column, the output of decode select portion MSGa, MSGb (MSGa#, MSGb#) is transmitted to each of read select gates RSGa, RSGb (RSGa#, RSGb#) which correspond to each of the paired memory cell blocks.

Between spare bit line SBL1 and two read data lines, spare select gates SSG1 and SSG1# are arranged in parallel, and between spare bit line SBL2 and two read data lines, spare select gates SSG2 and SSG2# are arranged in parallel.

In MRAM device 3#, a replacement of a defective column is carried out two by two, with a pair of two memory cell columns as a unit. Therefore, when a pair of memory cell columns including a defective memory cell is selected, the on/off of spare select gate SSG1, SSG1#, SSG2, SSG2# is controlled in a manner similar to read select gate RSGa, RSGb, RSGa#, RSGb# in the selected column depending on the decode mode.

The data read in MRAM device 3# will now be described.

The data read in one-cell decode mode is carried out based on the respective access to a selected memory cell in a selected memory cell block and dummy memory cell DMC in a non-selected memory cell block, in a manner similar to MRAM device 3 in accordance with the second embodiment.

For example where memory cell block 10A is a selected block and memory cell block 10B paired therewith is a non-selected memory cell block, in data read circuit 150, similar to the operation in one-cell decode mode in FIG. 15, switch 151 connects read data line RDL1A to each of nodes N1 and N3, and switch 152 connects read data line RDL2B connected with dummy memory cell DMC in the non-selected memory cell block, to node N4. Therefore, the data read in one-cell decode mode can be carried out in a manner similar to the MRAM device in accordance with the second embodiment.

The data read operation in two-cell decode mode will now be described with reference to FIG. 19.

Figure 19:
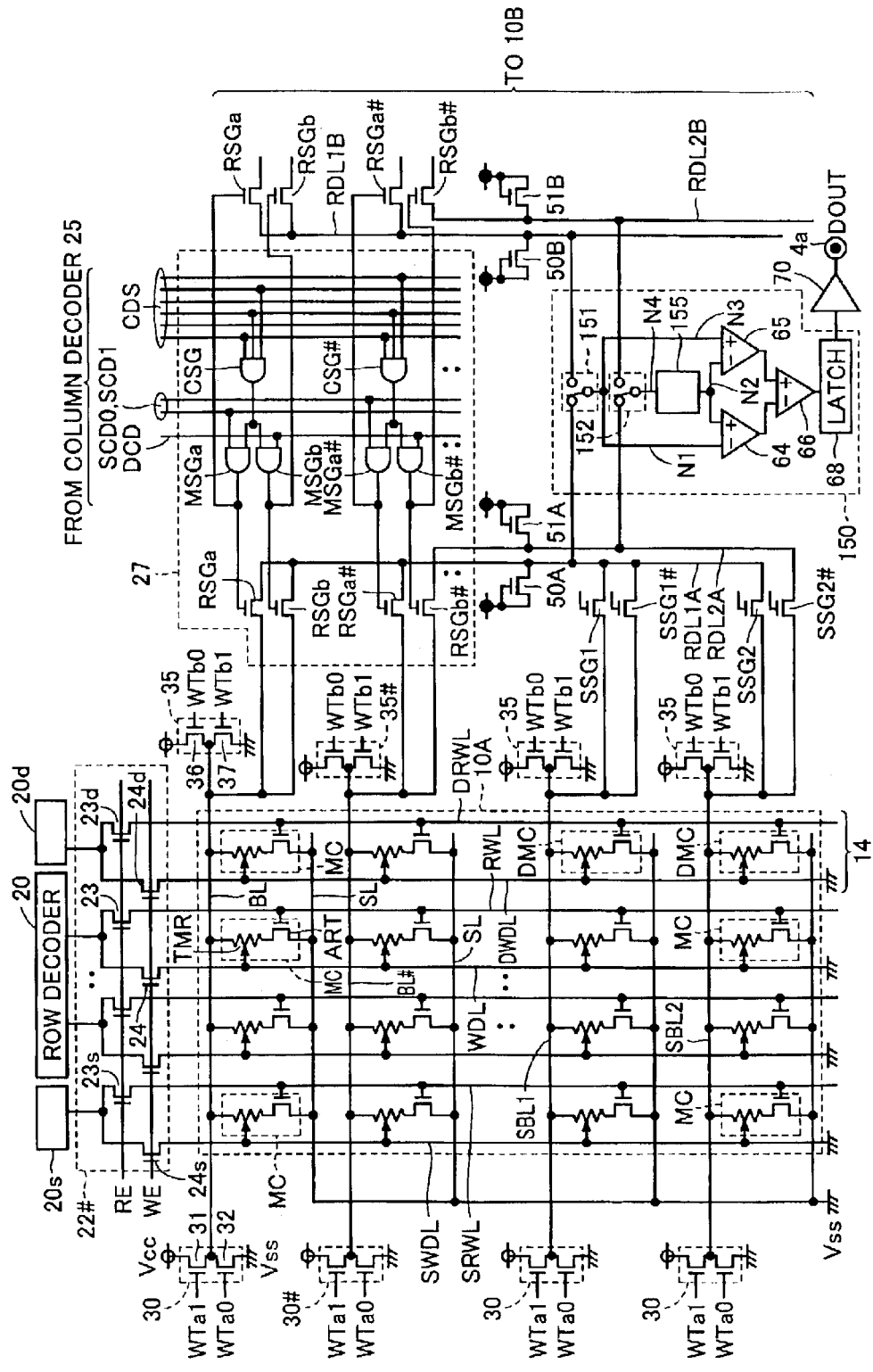
FIG. 19 is a circuit diagram illustrating a data read operation in two-cell decode mode in the MRAM device in accordance with the modification of the second embodiment.

Referring to FIG. 19, where memory cell block 10A is a selected memory cell block, in a manner similar to MRAM device 1 in accordance with the first embodiment, read select gates RSGb and RSGb# corresponding to a pair of memory cell columns including selected memory cells turn on. Accordingly, read data lines RDL1A and RDL2A in the selected memory cell block are electrically coupled to the two selected memory cells storing respective complimentary data. Data read circuit 150 connects one read data line RDL1A in the selected memory cell block to each of nodes N1 and N3, and switch 152 connects the other read data line RDL2A in the selected memory cell block to node N1. Similar to the configuration in accordance with the second embodiment, in two-cell decode mode, reference resistance applying circuit 155 is inactivated and no electric resistance is applied between nodes N2 and N4.

Therefore, data read circuit 150 can perform a data read based on the access to the paired, two selected memory cells belonging to the same memory cell block through the operation similar as illustrated in the second embodiment.

It is noted the operation in writing data is performed in a manner similar to that of MRAM device 1 in accordance with the first embodiment and the detailed description thereof will not be repeated.

As described above, the configuration in accordance with the modification of the second embodiment can attain the effect similar to that of the MRAM device in accordance with the second embodiment, where two selected memory cells to be accessed in parallel in two-cell decode mode belong to the same memory cell block.

Third Embodiment

In a third embodiment, a configuration employing an OUM (Ovonic Unified Memories) cell, which is noted as a different type of nonvolatile memory cell in place of MTJ memory cell, will be described.

The overview of OUM is disclosed for example in "Forefront of Non-Volatile Memory/The Future in Intel's Mind: From Flash Memory to OUM," Nikkei Microdevices, March, 2002, pp. 65–78. The OUM cell is formed of a thin film chalcogenide layer and a heater element. The chalcogenide attains an amorphous state or crystalline state depending on a heating pattern from the heater element through which a data write current passes. Nonvolatile data storage in OUM cell is carried out by setting two supply patterns of the data write current respectively corresponding to two heating patterns for attaining the amorphous state and crystalline state, depending on the level of the write data, as the electric resistance of the chalcogenide layer varies between the amorphous state and the crystalline state. Such an OUM cell is also included in the field in which the nonvolatile memory device in accordance with the present invention is applied.

Figure 20:
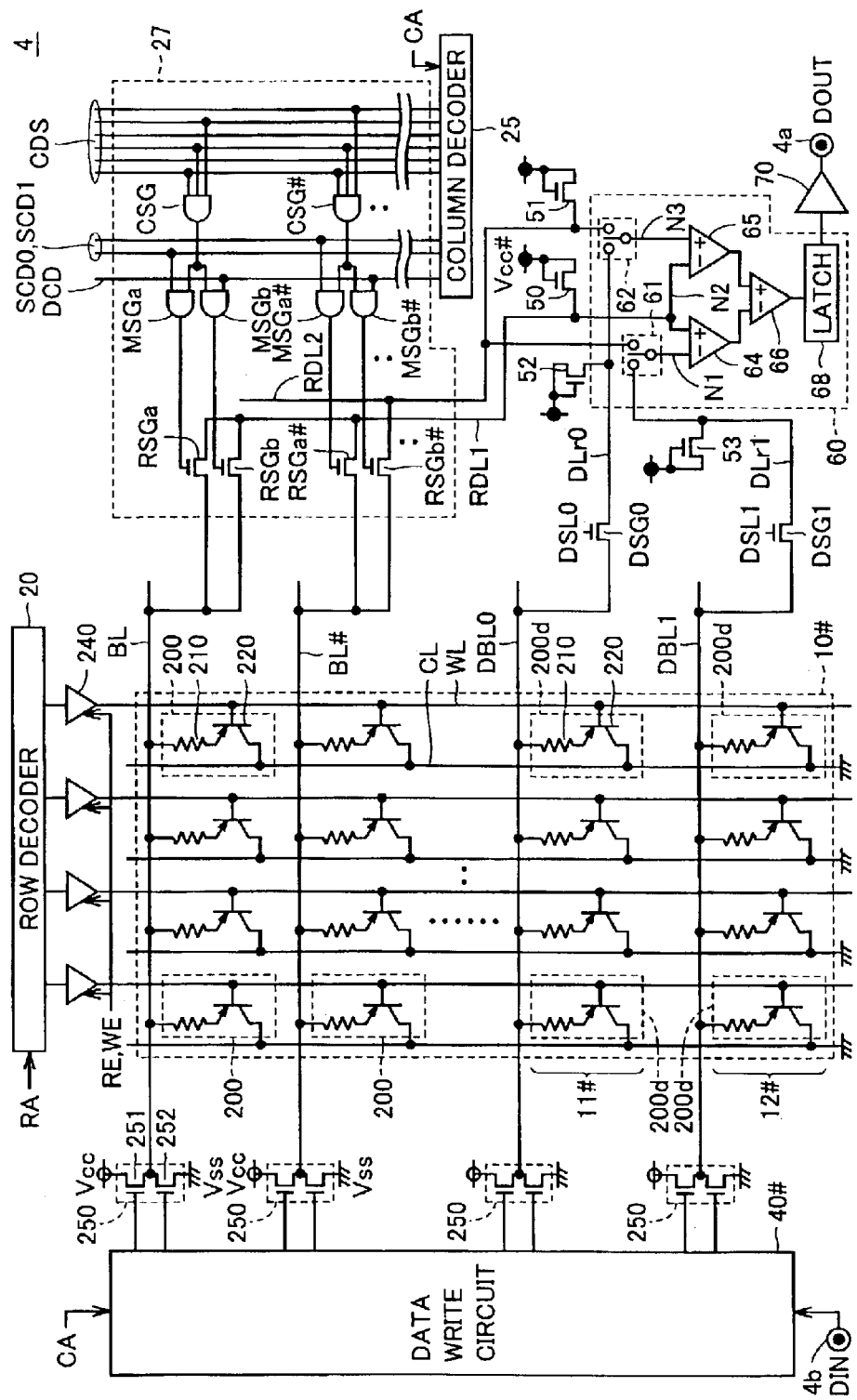
FIG. 20 is a circuit diagram illustrating an entire configuration of an OUM device shown as a representative example of a nonvolatile memory device in accordance with a third embodiment of the present invention.

FIG. 20 is a circuit diagram illustrating an overall configuration of an OUM device 4 shown as a representative example of the nonvolatile memory device in accordance with the third embodiment of the present invention.

Referring to FIG. 20, OUM device 4 in accordance with the third embodiment differs in configuration from MRAM device 1 in accordance with the first embodiment shown in FIG. 1 in that it includes a memory cell array 10# having OUM cells in place of memory cell array 10 having MTJ memory cells.

In memory cell array 10#, normal memory cells 200 and dummy memory cells 200d are provided using a plurality of OUM cells arranged in a matrix. Dummy memory cells 200d are arranged to form dummy cell columns 11# and 12# and share memory cell rows with memory cells 200.

Word lines WL and collector lines CL are arranged corresponding to the respective memory cell rows, and bit lines BL are arranged corresponding to the respective memory cell columns. Dummy bit lines DBL0 and DBL1 are provided corresponding to dummy cell columns 11# and 12#, respectively, in place of bit lines BL. Collector line CL is connected to ground voltage Vss.

Each of memory cell 200 and dummy memory cell 200d has a chalcogenide layer 210 and a switching transistor 220 connected in series between the corresponding bit line (or dummy bit line DBL0, DBL1) and collector line CL.

Here, the configuration and data storing principle of OUM cell will be described.

Figure 21:
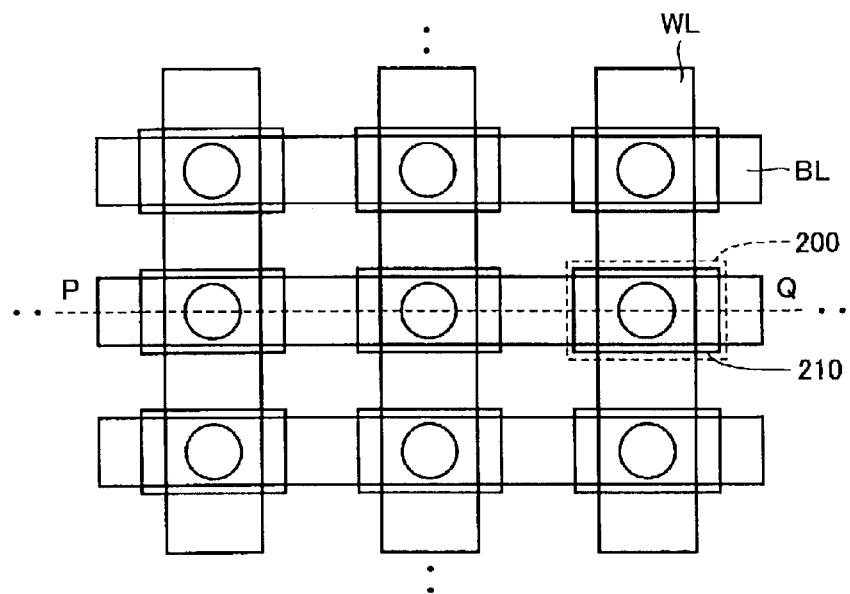
FIG. 21 is a planer view showing a partial memory cell array configured with OUM cells.

FIG. 21 is a plan view showing a part of the memory cell array formed of OUM cells.

Referring to FIG. 21, memory cell 200 having chalcogenide layer 210 is arranged corresponding to the cross point of word lines WL and bit lines BL arranged in a matrix.

Figure 22:
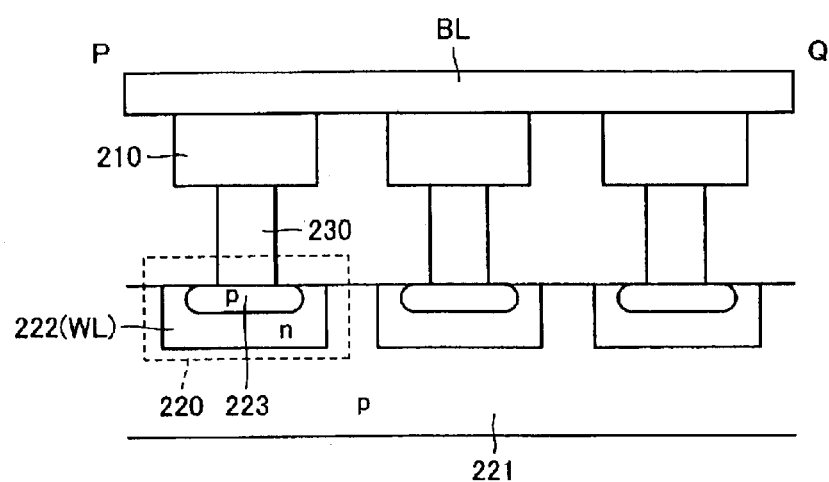
FIG. 22 is a cross sectional view taken along P-Q in FIG. 21.

FIG. 22 is a cross sectional view taken along P-Q in FIG. 21.

Referring to FIG. 22, switching transistor 220 has an n-type region 222 formed on a p-type region 221, and a p-type region 223 formed in n-type region 222. Switching transistor 220 is formed of a pnp-type vertical parasitic bipolar transistor made of p-type region 221, n-type region 222 and p-type region 223.

N-type region 222 corresponds to word line WL shown in FIGS. 20 and 21. Between chalcogenide layer 210 and switching transistor 220, a heater element 230 producing heat with a passing current is provided. In writing data, switching transistor 220 is turned on while a data write current passes from bit-line BL through chalcogenide layer 210 and heater element 230. In accordance with the supply pattern (for example a supply period and a supply current amount) of the data write current, chalcogenide layer 210 has its phase changed to one of the crystalline state and the amorphous state. Chalcogenide layer 210 has the respective different electric resistances in the amorphous state and in the crystalline state. Specifically, the chalcogenide layer in the amorphous state has an electric resistance higher than in the crystalline state.

Therefore, OUM cell has either of electric resistances Rmax and Rmin in accordance with stored data, similar to MTJ memory cell. It is noted that although the electric resistance at the time of data storage is different between MTJ memory cell and OUM cell, the two kinds of electric resistances depending on the level of the stored data are represented by Rmax and Rmin in common, in the present specification.

Accordingly, in reading data, data can be read in a manner similar to MTJ cell based on the electric resistance difference by turning on switching transistor 220 and passing a data read current having such a level that does not cause the phase change through chalcogenide layer 210.

Returning to FIG. 20, dummy memory cell 200d forming dummy cell column 11# fixedly stores stored data corresponding to electric resistance Rmax that is written beforehand. Similarly, each of dummy memory cells 200d forming dummy cell column 12# fixedly stores the electric resistance corresponding to electric resistance Rmin that is written beforehand.

Word line drivers 240 are provided corresponding to the respective word lines WL. Word line driver 240 activates word line WL in a selected row to H level in each of data read and data write in accordance with a row select result from row decoder 20.

For each bit line BL and each of dummy bit lines DBL0 and DBL1, bit line driver 250 is provided in place of bit line driver 30, 35 shown in FIG. 1. Bit line driver 250 has driver transistors 251 and 252 connected between power supply voltage Vcc and the corresponding bit line or dummy bit line DBL0, DBL1 and between power supply voltage Vcc and ground voltage Vss, respectively. Driver transistors 251 and 252 are formed of N-channel MOS transistors similar to driver transistors 31, 32, 35, and 36.

In each memory cell column, the amount of the passing current and the timing of current pass in the driver transistors 251 and 252 are controlled based on column address CA and input data DIN by data write circuit 40#.

Also in the MRAM device in accordance with the third embodiment, column select portion 27 allows the access to be switched between one-cell decode mode and two-cell decode mode. The detail thereof is similar as illustrated in the first embodiment and the description thereof will not be repeated.

As described above, since OUM cell and MTJ memory cell have a common data storing principle in that they have different electric resistances depending on the stored data, the data read configuration thereof can be basically realized with the same configuration. Therefore, the configuration for a data read is similar to that of MRAM device 1 shown in FIG. 1 and is provided with read data lines RDL1 and RDL2, reference data lines DLr0 and DLr1, read select gate RSG, dummy select gates DSG0 and DSG1, current supply transistors 50–53, data read circuit 60, and output buffer 70.

Figure 23:
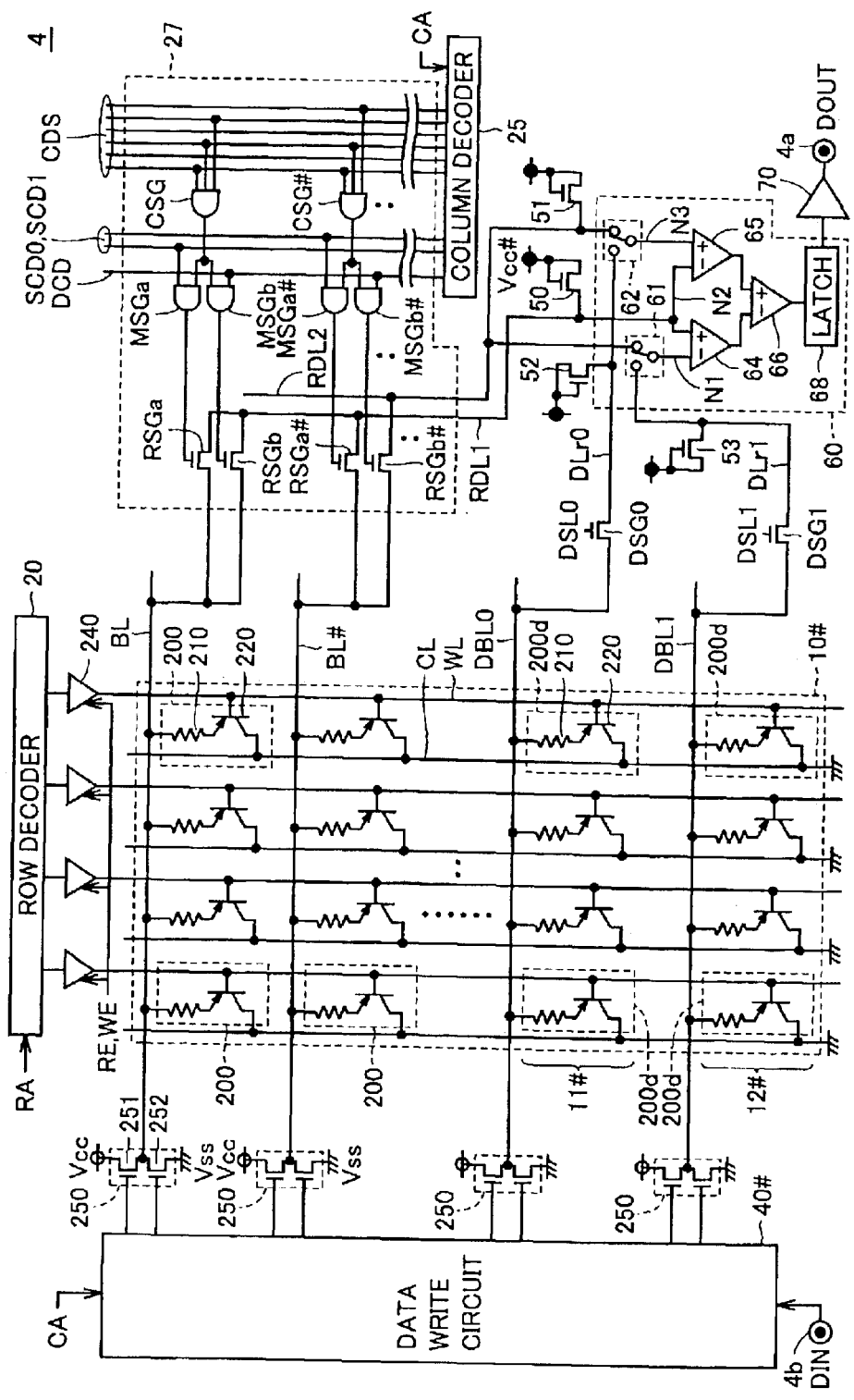
FIG. 23 is a circuit diagram illustrating a data read in the OUM device in accordance with the third embodiment.

FIG. 23 is a circuit diagram illustrating a data read in OUM device 4 in accordance with the third embodiment.

Referring to FIG. 23, word line driver 240 in a selected row activates the corresponding word line WL (n layer) to L level in response to the decode signal from the row decoder. Thus, while switching transistors 220 in memory cell 200 and dummy memory cell 200d in the selected row are turned on, switches 61 and 62 in data read circuit 60 are controlled in a manner similar to the first embodiment in each of one-cell decode mode and two-cell decode mode. Accordingly, the data reads from the selected memory cell can be performed in the respective decode modes.

It is noted that as described above, the power supply voltage Vcc# of current supply transistors 50–53 has to be set such that the passing current in OUM cell in reading data is suppressed to such a level that does not cause a phase change in the chalcogenide layer, that is, data write.

Figure 24:
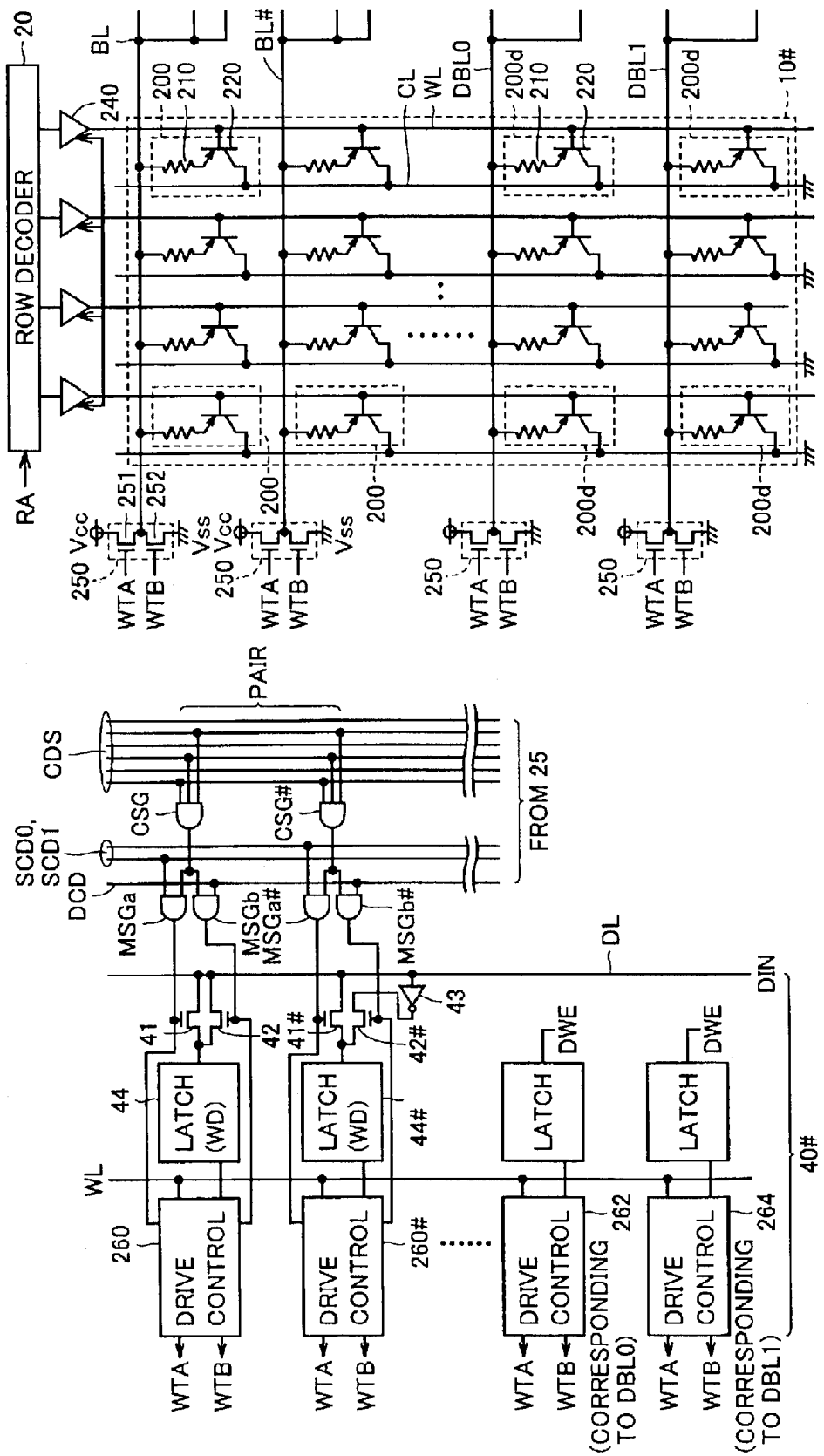
FIG. 24 is a circuit diagram showing a data write configuration in the OUM device in accordance with the third embodiment.

FIG. 24 is a circuit diagram showing a data write configuration in the OUM device in accordance with the third embodiment. FIG. 24 shows a configuration of data write circuit 40# shown in FIG. 20, in particular.

Referring to FIG. 24, data write circuit 40#, similar to data write circuit 40 shown in FIG. 6, has transmission gates 41 and 42, a latch circuit 44 and a drive control circuit 260 that are provided corresponding to each of odd columns, as well as transmission gates 41# and 42#, an inverter 43, a latch circuit 44#, and a drive control circuit 260# that are provided corresponding to each of even columns. Drive control circuits 262 and 264 are further provided for dummy bit lines DBL0 and DBL1 in the dummy cell columns.

The operation of transmission gate 41, 42, 41#, 42#, inverter 43, and latch circuit 44, 44# is similar as illustrated in FIG. 6 and the detailed description will not be repeated. More specifically, in one-cell decode mode, in one selected column corresponding to a selected memory cell, input data DIN is transmitted to the corresponding latch circuit 44 or 44# and held as write data WD. In two-cell decode mode, in the respective paired two selected columns corresponding to the selected memory cells, input data DIN and the inverted data thereof are transmitted to latch circuits 44 and 44#, respectively, and held as write data WD.

Each of drive control circuits 260 and 260# generates write control signals WTA and WTB controlling the operation of the corresponding bit line driver 250, in accordance with a select result of the corresponding memory cell column and write data WD latched in the corresponding latch circuit 44, 44#.

Each of drive control circuits 260 and 260# sets each of write control signals WTA and WTB to L level in order to perform a non-write operation except at the time of data write (control signal WE=L level) or when the corresponding memory cell column is a non-selected column even at the time of data write. Therefore, at the time of the non-write operation, the corresponding bit line BL (BL#) is set to a floating state.

On the contrary, each drive control circuit 260, 260# sets write control signals WTA, WTB in accordance with write data WD latched in the corresponding latch circuit 44, 44# at the time of data write (WE=H level) and when the corresponding memory cell column is selected.

Specifically, the on/off of the corresponding driver transistor 251, 252 is controlled by write control signal WTA, WTB. The on/off of driver transistor 251, 252 is controlled such that bit line BL, BL# has a flow of a data write current having such a pattern (for example a supply period and a supply current amount) that changes the chalcogenide layer 210 in phase to one of the crystalline state and the amorphous state that corresponds to write data WD.

The same configuration is provided corresponding to each odd column and each even column. It is noted that the drive voltage of bit line driver 30, 35 may be an independent voltage other than ground voltage Vss and power supply voltage Vcc.

As a result, similar to the MRAM device in accordance with the first embodiment, in writing data in one-cell decode mode, input data DIN is written in one selected memory cell while in writing data in two-cell decode mode, input data DIN is written in one of the paired two selected memory cells (an odd row) and the inverted data (complimentary data) of input data DIN is written in the other memory cell. In this way, in response to mode control signal MDS that is an electrical signal, the data read and data write operations can be switched corresponding to one-cell decode mode and two-cell decode mode.

It is noted that drive control circuit 262 provided corresponding to dummy bit line DBL0 supplies the data write current corresponding to the write of electric resistance Rmax to dummy bit line DBL0 in response to dummy write instruction DWE. Similarly, drive control circuit 264 provided corresponding to dummy bit line DBL1 supplies the data write current corresponding to the write of electric resistance Rmin to dummy bit line DBL1 in response to dummy write instruction DWE.

Figure 25:
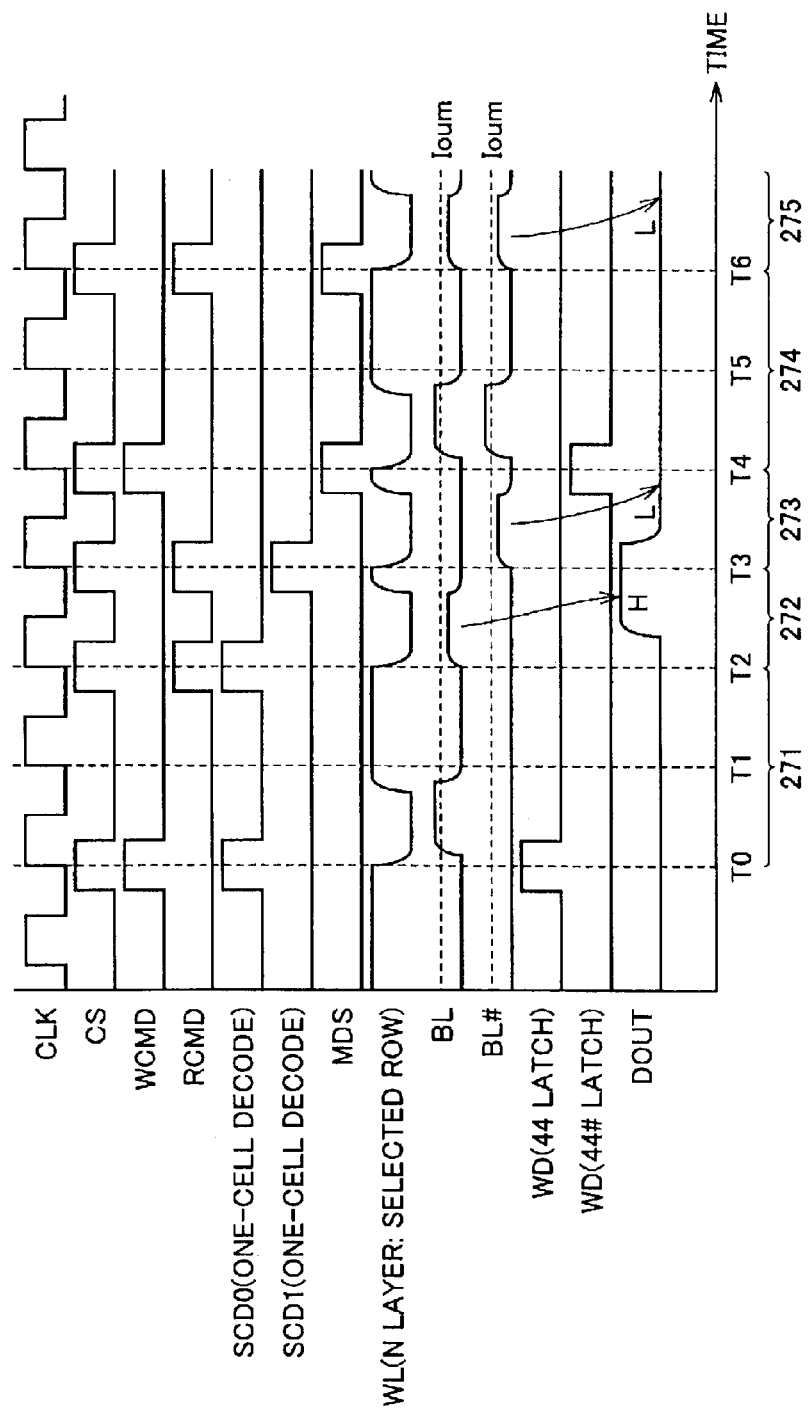
FIG. 25 is an operation waveform diagram illustrating the operation of the OUM device in accordance with the third embodiment.

FIG. 25 is an operation waveform diagram illustrating the operation of the OUM device in accordance with the third embodiment.

Referring to FIG. 25, similar to FIG. 7, the activation edges of clock signal CLK having a prescribed cycle are respectively shown at times T0–T6. In the OUM cell, the data read operation requires a relatively longer time since it is effectuated through heating and cooling of the chalcogenide element. Therefore, in the operational example in FIG. 25, one data read operation is performed in one clock cycle and one data write operation is performed in two clock cycles. Therefore, FIG. 25 shows cycles 271–275 in which the data write or the data read is performed.

Referring to FIG. 25, at time T0 when cycle 271 is started, the data write in one-cell decode mode is instructed. Therefore, in accordance with an address input at time T0, word line WL in a selected column is activated to L level and a data write current exceeding threshold Ioum flows in bit line BL in the selected column. Threshold Ioum represents a bit line passing current necessary for causing a phase change in the chalcogenide layer.

As a result, in cycle 271, input data DIN (write data WD) input at time T0 and latched in latch circuit 44 is written into one selected memory cell.

At time T2 when cycle 272 is started, a data read in one-cell decode mode is instructed. In this cycle, decode control signals SCD0 and SCD1 are set to H level and L level, respectively.

Therefore, in accordance with an address input at time T2, word line WL in the selected row is activated to L level and a current (and a voltage) corresponding to the electric resistance (Rmax or Rmin) of the selected memory cell is generated at a level under threshold Ioum in bit line BL in the selected column.

In one-cell decode mode, data is read based on the access to the selected memory cell through bit line BL in the selected column and the access to dummy memory cells 200d of electric resistances Rmax and Rmin. As a result, at time T3 in the next clock cycle, output data DOUT (for example "H level") read from the selected memory cell can be output.

At time T3 when cycle 273 is started, a data read in one-cell decode mode is instructed. In this cycle, decode control signals SCD0 and SCD1 are set to L level and H level, respectively. Therefore, in accordance with an address input at time T3, word line WL in the selected row is activated to L level, and a current (and a voltage) corresponding to the electric resistance (Rmax or Rmin) of the selected memory cell is generated at a level below threshold Ioum in bit line BL# in the selected column.

Data is read based on the access to the selected memory cell through bit line BL# in the selected column and the access to dummy memory cells 200d of electric resistances Rmax and Rmin. Accordingly, at time T4 in the next clock cycle, output data DOUT (for example "L level") read from the selected memory cell can be output.

At time T4 when cycle 274 is started, a data write in two-cell decode mode is instructed. Accordingly, in response to an address input at time T4, word line WL in the selected row is activated to L level, and data write currents respectively corresponding to input data DIN and the inverted data thereof are supplied to bit lines BL and BL# respectively corresponding to the paired two selected columns, based on write data WD latched by the corresponding latch circuits 44 and 44#. As a result, in cycle 274, complimentary data corresponding to input data DIN is written in parallel into the two selected memory cells.

At time T6 when the next cycle 275 is started, a data read in two-cell decode mode is instructed.

In cycle 275, in response to an address input at time T6, word line WL in a selected row is activated to L level. Furthermore, column select portion 27 allows bit lines BL and BL# in the paired two selected columns to be connected to data read circuit 60 through read data lines RDL1 and RDL2, respectively.

As a result, data is read based on the respective access to the two selected memory cells storing data complimentary to each other through bit lines BL and BL# in the selected columns. Accordingly, at time T7 (not shown) in the next clock cycle, output data DOUT (for example "L level") read from the selected memory cell can be output.

In this way, the OUM device employing OUM cells in place of MTJ memory cells can achieve the effect similar to that of MRAM device 1 in accordance with the first embodiment.

It is noted that OUM cell can be applied based on the similar arrangement also in the nonvolatile memory device in accordance with the first and second modifications of the first embodiment and the second embodiment and the modification thereof.

Fourth Embodiment

In a fourth embodiment, a configuration of a system LSI with a plurality of nonvolatile memory array blocks will be described where one-cell decode mode and two-cell decode mode can be realized in accordance with a level of the electrical signal as illustrated in the first to third embodiments.

Figure 26:
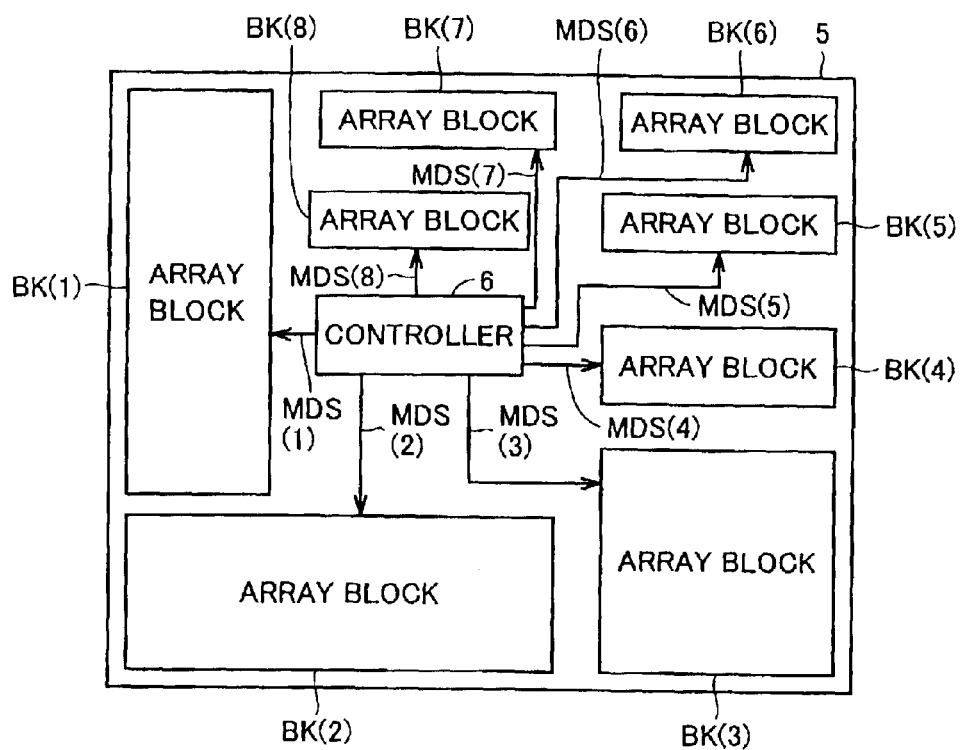
FIG. 26 is a schematic block diagram showing a configuration of a semiconductor integrated circuit device (system LSI) in accordance with a fourth embodiment.

FIG. 26 is a schematic block diagram showing the configuration of the system LSI shown as a representative example of a semiconductor integrated circuit device in accordance with the fourth embodiment.

Referring to FIG. 26, a system LSI 5 in accordance with the fourth embodiment includes a controller 6 and a plurality of array blocks BK (1)–BK (8). Each of array blocks BK (1)–BK (8) can employ the nonvolatile memory device illustrated in the first to third embodiments, that is, any of MRAM device 1, 2, 2#, 3, 3# and OUM device 4. Although the number of array blocks is set to eight by way of illustration in FIG. 26, any given number of array blocks may be employed.

Controller 6 provides independent mode control signals MDS (1)–MDS (8) to a plurality of array blocks BK (1)–BK (8), respectively. Array blocks BK (1)–BK (8) can be operated by switching one-cell decode mode having a priority in a data storage capacity and two-cell decode mode emphasizing data reliability in response to mode control signals MDS (1)–MDS (8) that are electrical signals. As described in the first embodiment, it is possible to provide both an operational region in one-cell decode mode and the operational region in two-cell decode mode in the same array block.

Generally, in system LSI, a memory region for code storage for storing operational commands of CPU (central processing unit) is merged with a memory region for data storage for performing data processing. Generally, while the memory region for data storage requires a large capacity, the memory region for code storage requires the reliability of stored data by priority. In this way, the memory region for data storage and the memory region for code storage require different features. If array blocks having different structures corresponding to the respective regions are designed, a complicated design and a complicated manufacturing cost will prevent a cost reduction.

Therefore, as in the system LSI shown in the fourth embodiment, one-cell decode mode having a priority in a data storage capacity and two-cell decode mode having a priority in the reliability of stored data can be switched in a software manner in each array block, thereby resulting in a flexible memory design using a common array configuration. As a result, the flexibility in setting memory regions in system LSI can be improved, and the cost and time in developing system LSI can be saved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile memory device comprising:

a memory cell array having a plurality of memory cells arranged in a matrix, each of said plurality of memory cells having a passing current in reading data changed in first and second states respectively in accordance with levels of binary stored data;

an access control circuit for switching access to said plurality of memory cells based on an input address between a first mode in which each of said plurality of memory cells stores one-bit data and a second mode in which each pair of two of said plurality of memory cells stores one-bit data;

a data read circuit performing a data read from a selected portion of said plurality of memory cells that is selected to be accessed by said access control circuit; and a data write circuit performing a data write into said selected portion of said plurality of memory cells.

2. The nonvolatile memory device according to claim 1, wherein said access control circuit controls switching of said access in accordance with an electrical signal.

3. The nonvolatile memory device according to claim 1, wherein
said access control circuit selects one memory cell of said plurality of memory cells as said selected portion in accordance with said address signal in said first mode, and
said access control circuit selects two memory cells forming said pair selected to be accessed as said selected portion in accordance with said address signal in said second mode.

4. The nonvolatile memory device according to claim 3, wherein
said data write circuit writes data at complimentary levels respectively into said two memory cells selected by said access control circuit in said second mode.

5. The nonvolatile memory device according to claim 3, wherein
said memory cell array further includes a dummy cell provided to be compared with one of said plurality of memory cells in reading data,
said data read circuit performs said data read based on a comparison of respective access to said one memory cell selected by said access control circuit and to said dummy cell in said first mode, and
said data read circuit performs said data read based on respective access to said two memory cells selected by said access control circuit in said second mode.

6. The nonvolatile memory device according to claim 5, wherein
said data read circuit includes
a first node electrically connected to said one memory cell and one of said two memory cells selected by said access control circuit in said first and second modes, respectively,
a second node,
a first amplifier outputting a voltage produced by amplifying one of a voltage difference and a current difference between said first and second nodes,
a first switch circuit electrically connecting said dummy cell to said first node in said first mode and electrically coupling the other of said two memory cells selected by said access control circuit to said first node in said second mode,
a second amplifier amplifying a voltage difference between said voltage output from said first amplifier and a third node,
a second switch electrically connecting an output node of said second amplifier and said third node during a prescribed period after an operation of said reading data is started, and electrically isolating said output node from said third node after said prescribed period, and
a latch circuit generating read data in accordance with a voltage at said output node after said prescribed period.

7. The nonvolatile memory device according to claim 1, wherein
two memory cells forming same said pair share one of a memory cell row and a memory cell column.

8. The nonvolatile memory device according to claim 1, wherein
said plurality of memory cells are arranged to be divided into a plurality of memory cell blocks,
said access control circuit selects two memory cells respectively belonging to different ones of said plurality of memory cell blocks as said selected portion in said second mode, and
said two memory cells are selected by a common address signal respectively in said different ones of memory cell blocks.

9. The nonvolatile memory device according to claim 1, wherein
a plurality of said memory cell arrays are provided,
said access control circuit, said data read circuit and said data write circuit are provided corresponding to each of said plurality of memory cell arrays, and
a plurality of said access control circuits respectively corresponding to said plurality of memory cell arrays control switching of said access respectively in accordance with independent electrical signals.

10. The nonvolatile memory device according to claim 1, wherein
each of said plurality of memory cells has
a first magnetic layer having a fixed magnetization direction,
a second magnetic layer magnetized in a direction corresponding to a magnetic field created by a data write current controlled in accordance with a level of data to be written, and
an insulating film formed between said first and second magnetic layers.

11. The nonvolatile memory device according to claim 1, wherein
each of said plurality of memory cells has
a heater element generating heat with a data write current controlled in accordance with a level of data to be written and
a phase changing element heated by said heater element for allowing for a transition between two different phase states.

12. A nonvolatile memory device comprising:
a plurality of memory cells each having a passing current in reading data changed in first and second states respectively in accordance with levels of binary stored data;
a plurality of dummy cells provided to be compared with said plurality of memory cells in said reading data and having same characteristic as said plurality of memory cells, wherein
at least ones of said plurality of dummy cells are respectively set to said first and second states; and
a data read circuit, based on access to a selected memory cell selected to be accessed of said plurality of memory cells and to said plurality of dummy cells, reading said stored data from said selected memory.

13. The nonvolatile memory device according to claim 12, wherein
said plurality of memory cells are arranged in rows and columns,
said plurality of dummy cells are arranged to form a plurality of dummy cell columns to share said rows with said plurality of memory cells,
each of dummy cells belonging to one of said plurality of dummy cell columns is set to said first state, and
each of dummy cells belonging to another one of said plurality of dummy cell columns is set to said second state.

14. The nonvolatile memory device according to claim 12, wherein
said data read circuit reads said stored data in said selected memory cell in accordance with a comparison of respective access to one of said plurality of memory cells that is set to said first state and to said selected memory cell and a comparison of respective access to another one of said plurality of memory cells that is set to said second state and to said selected memory cell.

15. The nonvolatile memory device according to claim 12, further comprising:
   a first reference data line electrically connected to one of said plurality of dummy cells that is set to said first state in said reading data;
   a second reference data line electrically connected to another one of said plurality of dummy cells that is set to said second state in said reading data; and
   a switch for making a short circuit between said first and second reference data lines in said reading data, wherein
      said data read circuit reads said stored data in said selected memory cell based on one of a current difference and a voltage difference between at least one of said first and second reference data lines and said selected memory cell.

16. A nonvolatile memory device comprising:
   a plurality of memory cell blocks; and
   a data read circuit provided to be shared by said plurality of memory cell blocks,
   each of said plurality of memory cell blocks including
      a plurality of memory cells each having a passing current in reading data changed in first and second states respectively in accordance with levels of binary stored data and
      a plurality of dummy cells provided to be compared with said plurality of memory cells in said reading data and having same characteristics as said plurality of memory cells, wherein
         one of said plurality of memory cells is selected as a read target memory cell from which data is to be read in one of said plurality of memory cell blocks, and
         said data read circuit reads said stored data from said read target memory cell based on respective access to said read target memory cell and to one of said plurality of dummy memory cells included in another one of said plurality of memory cell blocks.

17. The nonvolatile memory device according to claim 16, wherein
   in each of said plurality of memory cell blocks, said plurality of memory cells are arranged in rows and columns, and said plurality of dummy cells are arranged to form a dummy cell row to share said columns with said plurality of memory cells,
   each of said plurality of memory cell blocks further includes a plurality of bit lines provided corresponding to said columns, and
   said data read circuit is electrically connected to one of said plurality of bit lines included in said one of said plurality of memory cells that corresponds to said read target memory cell and one of said plurality of bit lines included in said another one of said plurality of memory cell blocks.

18. The nonvolatile memory device according to claim 16, wherein
   each of said plurality of memory cells has a first electric resistance and a second electric resistance higher than said first resistance in said first and second states, respectively,
   said data read circuit includes
      a resistance applying circuit for applying an electric resistance smaller than a difference between said first and second electric resistances to a first current path including said one of said plurality of dummy cells and
      an amplifier amplifying a passing current difference between a second current path including said read target memory cell and said first current path, and
   said data read circuit reads said stored data from said read target memory cell in accordance with an output of said amplifier.

* * * * *